US009673798B1

(12) United States Patent
Tang et al.

(10) Patent No.: US 9,673,798 B1
(45) Date of Patent: Jun. 6, 2017

(54) DIGITAL PULSE WIDTH DETECTION BASED DUTY CYCLE CORRECTION

(71) Applicant: SANDISK TECHNOLOGIES LLC, Plano, TX (US)

(72) Inventors: Tianyu Tang, Milpitas, CA (US); Venkatesh Ramachandra, San Jose, CA (US); Srinivas Rajendra, Milpitas, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/226,574

(22) Filed: Aug. 2, 2016

Related U.S. Application Data

(60) Provisional application No. 62/364,507, filed on Jul. 20, 2016.

(51) Int. Cl.
*G11C 7/22* (2006.01)
*H03K 5/156* (2006.01)
*G11C 8/18* (2006.01)
*G11C 13/00* (2006.01)
*G11C 16/32* (2006.01)

(52) U.S. Cl.
CPC ............. *H03K 5/1565* (2013.01); *G11C 8/18* (2013.01); *G11C 13/0061* (2013.01); *G11C 16/32* (2013.01)

(58) Field of Classification Search
CPC ...................................................... G11C 7/222
USPC ........................................................ 365/194
See application file for complete search history.

(56) References Cited

U.S. PATENT DOCUMENTS

| | | | | |
|---|---|---|---|---|
| 6,895,522 | B2 * | 5/2005 | Johnson | ............... G06F 1/12 |
| | | | | 365/233.11 |
| 7,187,221 | B2 | 3/2007 | Kim | |
| 7,830,185 | B2 | 11/2010 | Kim | |
| 7,839,192 | B1 | 11/2010 | Wang | |
| 7,940,103 | B2 * | 5/2011 | Satoh | .............. H03K 5/1565 |
| | | | | 327/155 |

(Continued)

OTHER PUBLICATIONS

Agarwal, et al., A Duty-Cycle Correction Circuit for High-Frequency Clocks, 2006 Symposium on VLSI Circuits, Digest of Technical Papers, Jun. 15-17, 2006.

(Continued)

*Primary Examiner* — Min Huang
(74) *Attorney, Agent, or Firm* — Vierra Magen Marcus LLP

(57) ABSTRACT

Systems and methods for generating periodic signals with reduced duty cycle variation are described. In some cases, a calibration procedure may be performed prior to a memory operation (e.g., prior to a read operation or a programming operation) in which a duty cycle correction circuit receives an input signal (e.g., an input clock signal), steps through various delay settings to determine a first delay setting corresponding with a signal high time for the input signal and a second delay setting corresponding with a signal low time for the input signal, generates a delayed version of the input signal corresponding with a mid-point delay setting between the first delay setting and the second delay setting, and generates a corrected signal using the delayed version of the input signal and the input signal.

20 Claims, 21 Drawing Sheets

(56) References Cited

U.S. PATENT DOCUMENTS

| | | | | |
|---|---|---|---|---|
| 8,644,085 B2* | 2/2014 | Kim | ............... | H03K 5/1565 |
| | | | | 327/175 |
| 2004/0062121 A1* | 4/2004 | Chung | ............... | G11C 7/22 |
| | | | | 365/222 |
| 2007/0030754 A1* | 2/2007 | Gomm | ............... | G11C 7/1072 |
| | | | | 365/233.13 |
| 2007/0086267 A1* | 4/2007 | Kwak | ............... | G11C 7/02 |
| | | | | 365/233.1 |
| 2013/0028029 A1* | 1/2013 | Huang | ............... | G11C 7/222 |
| | | | | 365/189.07 |
| 2014/0293713 A1* | 10/2014 | Gomm | ............... | H03L 7/0812 |
| | | | | 365/189.07 |

OTHER PUBLICATIONS

Yun, et al., "A Digital DLL with Hybrid DCC Using 2-Step Duty Error Extraction and 180° Phase Aligner for 2.67Gb/s/ pin 16Gb 4-H Stack DDR4 SDRAM with TSVs," Samsung Electronics, 2015 IEEE International Solid-State Circuits conference, Feb. 2015.

\* cited by examiner

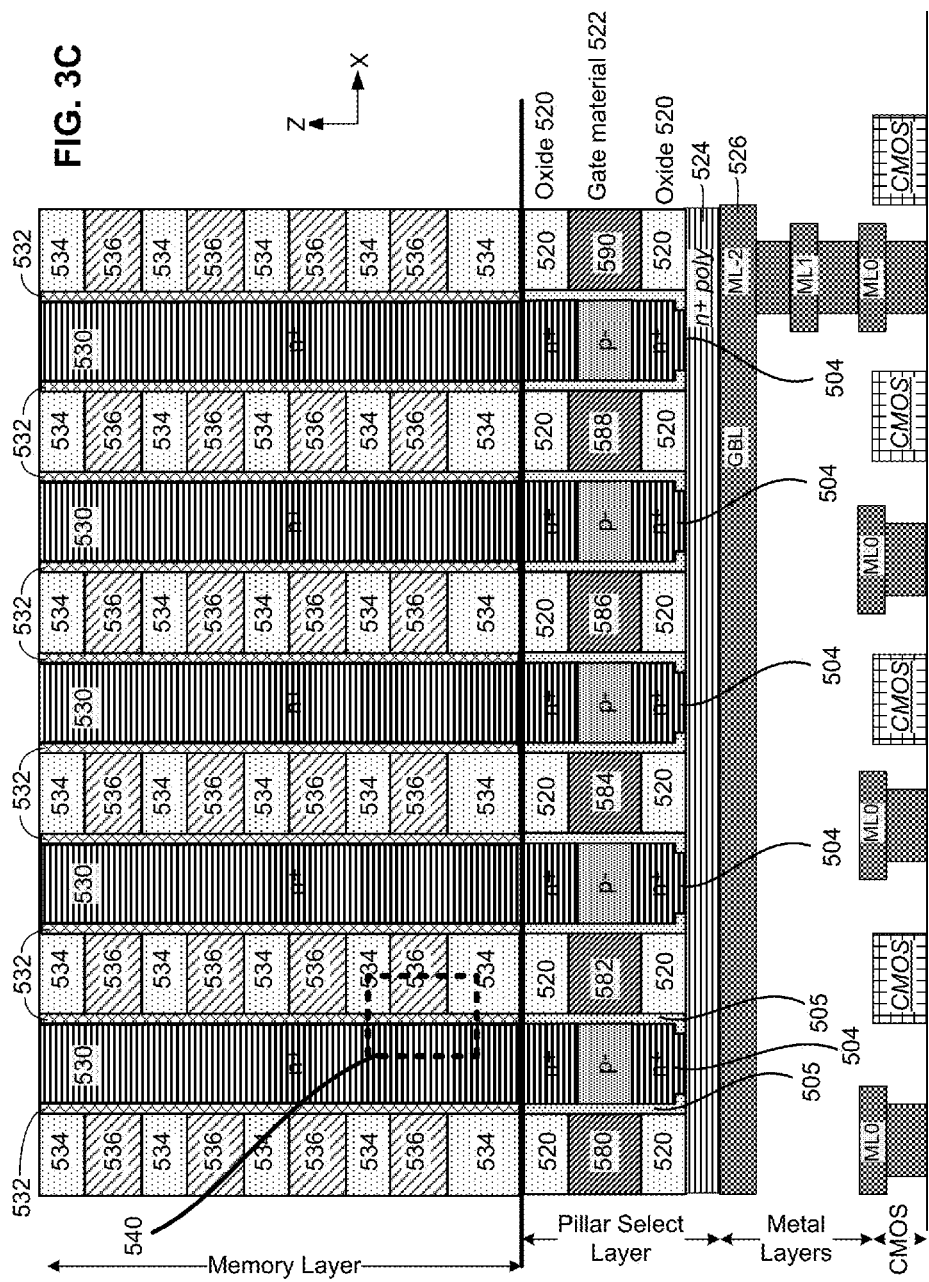

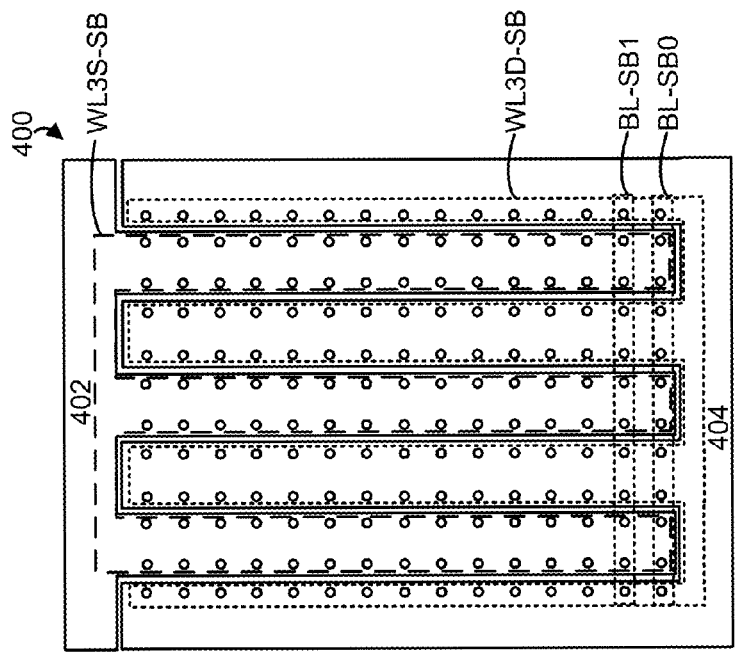
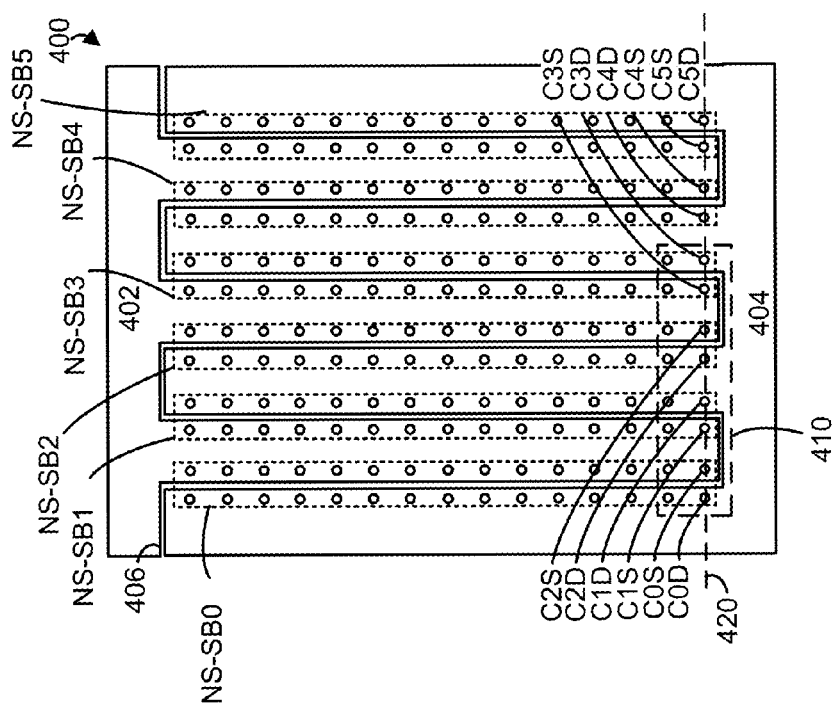
FIG. 4F
FIG. 4E

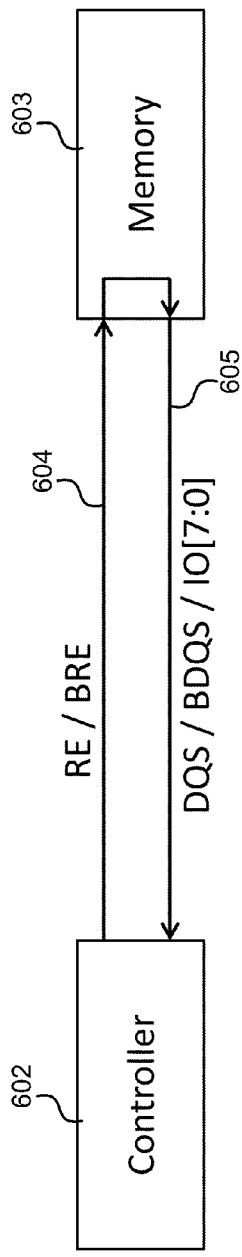
FIG. 6A
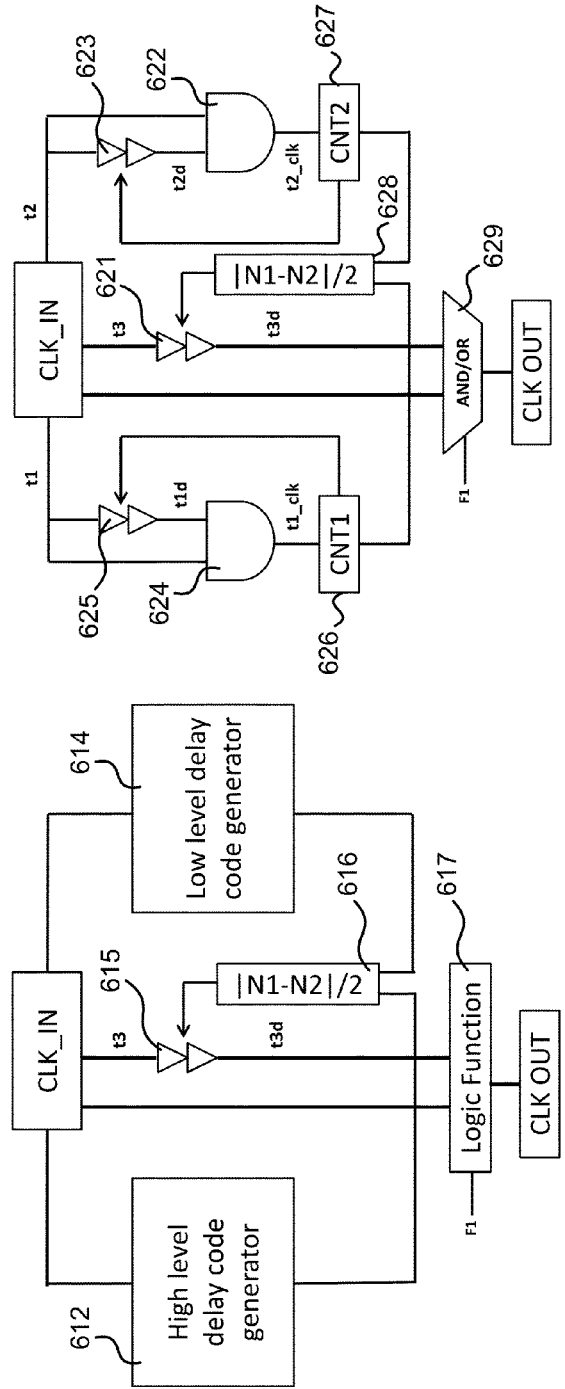
FIG. 6C
FIG. 6B

DIGITAL PULSE WIDTH DETECTION BASED DUTY CYCLE CORRECTION

CLAIM OF PRIORITY

The present application claims priority to U.S. Provisional Application No. 62/364,507, entitled "Digital Pulse Width Detection Based Duty Cycle Correction," filed Jul. 20, 2016, which is herein incorporated by reference in its entirety.

BACKGROUND

Semiconductor memory is widely used in various electronic devices such as mobile computing devices, mobile phones, solid-state drives, digital cameras, personal digital assistants, medical electronics, servers, and non-mobile computing devices. Semiconductor memory may comprise non-volatile memory or volatile memory. A non-volatile memory device allows information to be stored or retained even when the non-volatile memory device is not connected to a source of power (e.g., a battery). Examples of non-volatile memory include flash memory (e.g., NAND-type and NOR-type flash memory), Electrically Erasable Programmable Read-Only Memory (EEPROM), ferroelectric memory (e.g., FeRAM), magnetoresistive memory (e.g., MRAM), and phase change memory (e.g., PRAM). In recent years, non-volatile memory devices have been scaled in order to reduce the cost per bit. However, as process geometries shrink, many design and process challenges are presented. These challenges include increased variability in signal delays over process, voltage, and temperature variations.

BRIEF DESCRIPTION OF THE DRAWINGS

FIGS. 3A-3C depict various embodiments of a portion of a three-dimensional memory array.

FIGS. 4E-4J depict various embodiments of NAND structures.

FIG. 6A depicts one embodiment of a signaling interface between a controller and a memory chip.

FIG. 6B depicts one embodiment of a duty cycle correction circuit.

FIG. 6C depicts another embodiment of a duty cycle correction circuit.

DETAILED DESCRIPTION

Figure 1A:
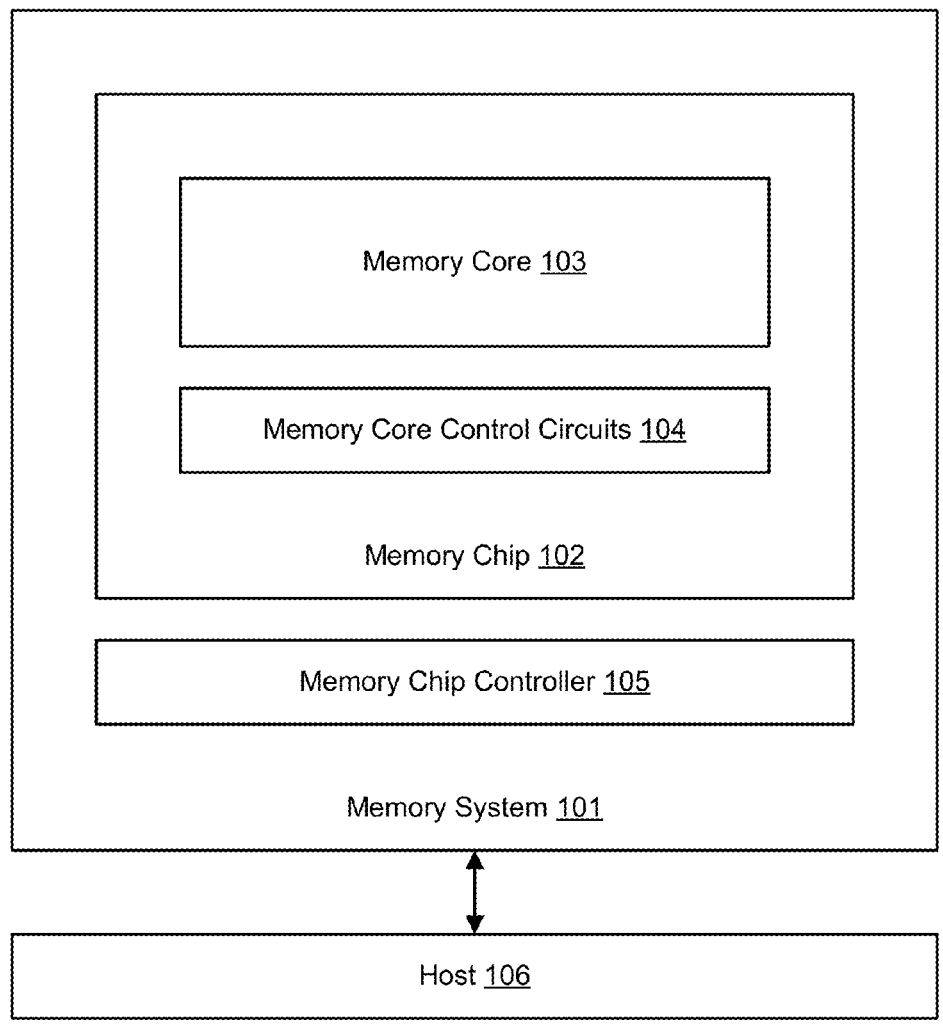
FIGS. 1A-1E depict various embodiments of a memory system.

Technology is described for generating a signal with reduced duty cycle variation. The signal may comprise a data strobe signal outputted from a memory die. The memory die may comprise a NAND memory die or a ReRAM memory die. In some cases, a calibration procedure may be performed prior to a memory operation (e.g., prior to a read operation or a programming operation) in which an on-die duty cycle correction circuit receives an input signal (e.g., an input clock signal provided via a read-enable signal RE), steps through various delay settings to determine a first delay setting corresponding with a signal high time for the input signal and a second delay setting corresponding with a signal low time for the input signal, generates a delayed version of the input signal corresponding with a mid-point delay setting between the first delay setting and the second delay setting, and generates a corrected signal using the delayed version of the input signal and the input signal. In one example, the duty cycle correction circuit may receive a single periodic signal (e.g., a single clock signal) and generate a single corrected periodic signal with a corrected duty cycle. In another example, the duty cycle correction circuit may receive a pair of periodic signals (e.g., a clock signal and the inverse of the clock signal) and generate a pair of corrected periodic signals with corrected duty cycles. The duty cycle correction circuit may generate the corrected signal via application of a first logical operation (e.g., a logical AND operation) to the delayed version of the input signal and the input signal if a first period of time during which the input signal is at a high level is greater than a second period of time during which the input signal is at a low level or application of a second logical operation (e.g., a logical OR operation) to the delayed version of the input signal and the input signal if the first period of time is not greater than the second period of time.

In one embodiment, a duty cycle correction circuit may be used for generating a source synchronous signal that is outputted from a memory die. With a source-synchronous interface, a transmitting device (e.g., the data source, such as a memory die during a read operation) may send a synchronizing signal (e.g., a clock signal or a data strobe signal) along with the data being transmitted. A receiving device (e.g., a memory controller during a read operation) may use the synchronizing signal to capture the data being transmitted from the transmitting device. In another embodiment, a duty cycle correction circuit may be used for generating an on-chip periodic signal used for synchronizing signals on a memory die, a ReRAM die, a NAND die, a DRAM, a microprocessor, an FPGA, or an integrated circuit. In another embodiment, a duty cycle correction circuit may be used for generating an off-chip periodic signal used for synchronizing signals sent from a memory die, a ReRAM die, a NAND die, a DRAM, a microprocessor, an FPGA, or an integrated circuit.

NAND page sizes have increased over time as NAND storage capacities have increased. While a larger page size (e.g., a 2 kB or 8 kB page size) may allow a greater amount of data to be read or written at a time, it may also increase the data transfer time between a memory controller and a memory die. In some cases, the total time required to read from or write to the memory die may be determined based on memory array access time and the data transfer time between the memory controller and the memory die. For large page sizes, the data transfer time between the memory controller and the memory die may be a significant component of the total time required to read from or write to the memory die. In some cases, the signaling interface between the memory die and the memory controller may comprise an asynchronous double data rate (DDR) interface or a synchronous DDR interface. The asynchronous double data rate (DDR) interface may provide signaling between the memory controller and the memory die without a continuous periodic clock signal; instead, a bidirectional data strobe signal (e.g., a DQS signal) may be used to facilitate reading from or writing to the memory die. In one example, the bidirectional data strobe signal may be driven by the memory controller when it is writing data to the memory die and may be driven by the memory die when the memory die is sending data to the memory controller. Each rising and falling edge of the data strobe signal may be associated with a data transfer. One benefit of improving the duty cycle of synchronizing signals, such as data strobe signals, is that the effective data valid window may be increased and therefore the total time required to read from or write to the memory die may be reduced.

In one embodiment, a non-volatile storage system or a memory die may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate or substantially orthogonal to the substrate (e.g., within 2-5 degrees of a normal vector that is orthogonal to the substrate). In one example, a non-volatile storage system may include a memory array with vertical bit lines or bit lines that are arranged orthogonal to a semiconductor substrate. The substrate may comprise a silicon substrate. The memory array may comprise various memory structures including planar NAND structures, vertical NAND structures, Bit Cost Scalable (BiCS) NAND structures, 3D NAND structures, or 3D ReRAM structures.

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, or control circuitry for controlling the reading and/or programming of the memory cells). The circuitry associated with the operation of the memory cells may be located above the substrate or located within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

In one embodiment, the memory cells within a memory array may comprise re-writable non-volatile memory cells including a reversible resistance-switching element. A reversible resistance-switching element may include a reversible resistivity-switching material having a resistivity that may be reversibly switched between two or more states. In one embodiment, the reversible resistance-switching material may include a metal oxide (e.g., a binary metal oxide). The metal oxide may include nickel oxide or hafnium oxide. In another embodiment, the reversible resistance-switching material may include a phase change material. The phase change material may include a chalcogenide material. In some cases, the re-writeable non-volatile memory cells may comprise resistive RAM (ReRAM) memory cells. In other cases, the re-writeable non-volatile memory cells may comprise conductive bridge memory cells or programmable metallization memory cells.

FIG. 1A depicts one embodiment of a memory system 101 and a host 106. The memory system 101 may comprise a non-volatile storage system interfacing with the host (e.g., a mobile computing device or a server). In some cases, the memory system 101 may be embedded within the host 106. As examples, the memory system 101 may comprise a memory card, a solid-state drive (SSD) such a high density MLC SSD (e.g., 2-bits/cell or 3-bits/cell) or a high performance SLC SSD, or a hybrid HDD/SSD drive. As depicted, the memory system 101 includes a memory chip controller 105 and a memory chip 102. The memory chip 102 may include volatile memory and/or non-volatile memory. Although a single memory chip is depicted, the memory system 101 may include more than one memory chip (e.g., four or eight memory chips). The memory chip controller 105 may receive data and commands from host 106 and provide memory chip data to host 106. The memory chip controller 105 may include one or more state machines, page registers, SRAM, and control circuitry for controlling the operation of memory chip 102. The one or more state machines, page registers, SRAM, and control circuitry for controlling the operation of the memory chip may be referred to as managing or control circuits. The managing or control circuits may facilitate one or more memory array operations including forming, erasing, programming, or reading operations.

In some embodiments, the managing or control circuits (or a portion of the managing or control circuits) for facilitating one or more memory array operations may be integrated within the memory chip 102. The memory chip controller 105 and memory chip 102 may be arranged on a single integrated circuit or arranged on a single die. In other embodiments, the memory chip controller 105 and memory chip 102 may be arranged on different integrated circuits. In some cases, the memory chip controller 105 and memory chip 102 may be integrated on a system board, logic board, or a PCB.

The memory chip 102 includes memory core control circuits 104 and a memory core 103. Memory core control circuits 104 may include logic for controlling the selection of memory blocks (or arrays) within memory core 103, controlling the generation of voltage references for biasing a particular memory array into a read or write state, and generating row and column addresses. The memory core 103 may include one or more two-dimensional arrays of memory cells or one or more three-dimensional arrays of memory cells. In one embodiment, the memory core control circuits 104 and memory core 103 may be arranged on a single integrated circuit. In other embodiments, the memory core control circuits 104 (or a portion of the memory core control circuits) and memory core 103 may be arranged on different integrated circuits.

Referring to FIG. 1A, a memory operation may be initiated when host 106 sends instructions to memory chip controller 105 indicating that it would like to read data from memory system 101 or write data to memory system 101. In the event of a write (or programming) operation, host 106 may send to memory chip controller 105 both a write command and the data to be written. The data to be written may be buffered by memory chip controller 105 and error correcting code (ECC) data may be generated corresponding with the data to be written. The ECC data, which allows data errors that occur during transmission or storage to be detected and/or corrected, may be written to memory core 103 or stored in non-volatile memory within memory chip controller 105. In one embodiment, the ECC data is generated and data errors are corrected by circuitry within memory chip controller 105.

Referring to FIG. 1A, the operation of memory chip 102 may be controlled by memory chip controller 105. In one example, before issuing a write operation to memory chip 102, memory chip controller 105 may check a status register to make sure that memory chip 102 is able to accept the data to be written. In another example, before issuing a read operation to memory chip 102, memory chip controller 105 may pre-read overhead information associated with the data to be read. The overhead information may include ECC data associated with the data to be read or a redirection pointer to a new memory location within memory chip 102 in which to read the data requested. Once a read or write operation is initiated by memory chip controller 105, memory core control circuits 104 may generate the appropriate bias voltages for word lines and bit lines within memory core 103, as well as generate the appropriate memory block, row, and column addresses.

In some embodiments, one or more managing or control circuits may be used for controlling the operation of a memory array within the memory core 103. The one or more managing or control circuits may provide control signals to a memory array in order to perform a read operation and/or a write operation on the memory array. In one example, the one or more managing or control circuits may include any one of or a combination of control circuitry, state machines, decoders, sense amplifiers, read/write circuits, and/or controllers. The one or more managing circuits may perform or facilitate one or more memory array operations including erasing, programming, or reading operations. In one example, one or more managing circuits may comprise an on-chip memory controller for determining row and column address, word line and bit line addresses, memory array enable signals, and data latching signals.

Figure 1B:
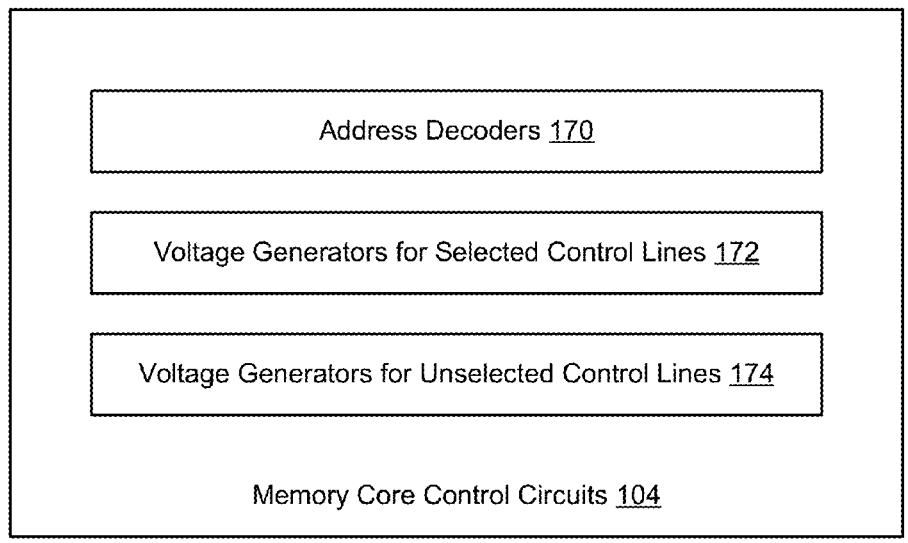

FIG. 1B depicts one embodiment of memory core control circuits 104. As depicted, the memory core control circuits 104 include address decoders 170, voltage generators for selected control lines 172, and voltage generators for unselected control lines 174. Control lines may include word lines, bit lines, or a combination of word lines and bit lines. Selected control lines may include selected word lines or selected bit lines that are used to place memory cells into a selected state. Unselected control lines may include unselected word lines or unselected bit lines that are used to place memory cells into an unselected state. The voltage generators (or voltage regulators) for selected control lines 172 may comprise one or more voltage generators for generating selected control line voltages. The voltage generators for unselected control lines 174 may comprise one or more voltage generators for generating unselected control line voltages. Address decoders 170 may generate memory block addresses, as well as row addresses and column addresses for a particular memory block.

Figure 1C:
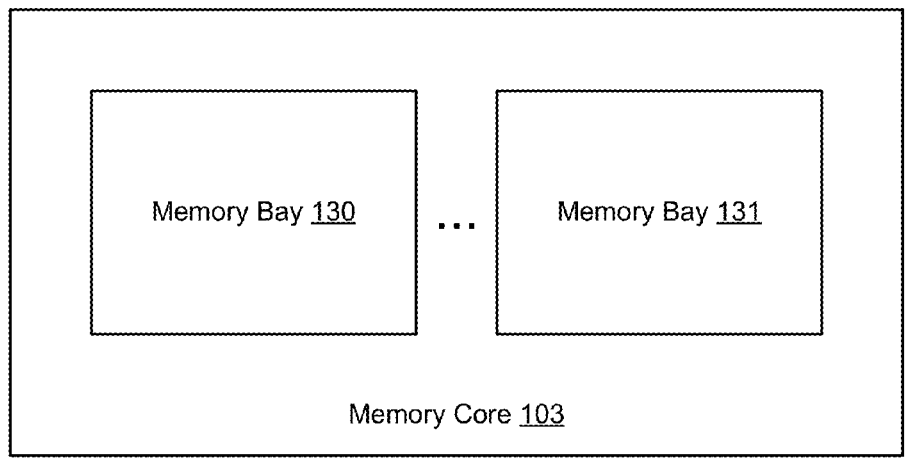
Figure 1D:
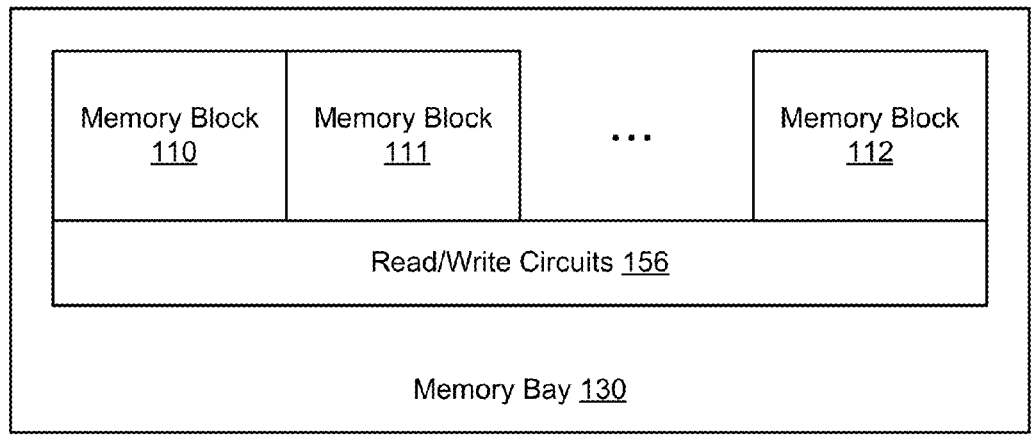
Figure 1E:
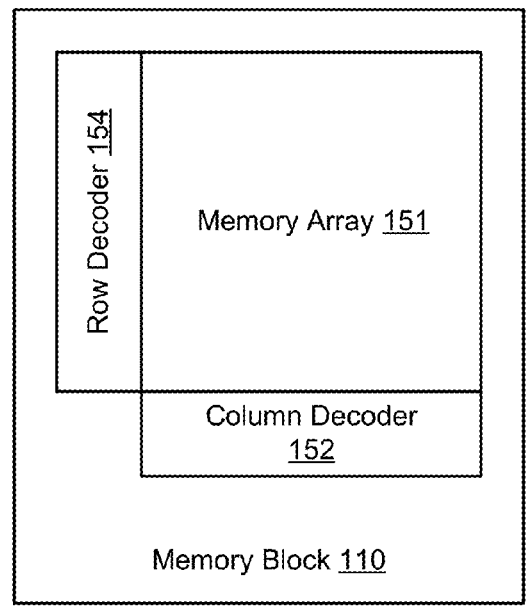

FIGS. 1C-1E depict one embodiment of a memory core organization that includes a memory core having multiple memory bays, and each memory bay having multiple memory blocks. Although a memory core organization is disclosed where memory bays comprise memory blocks, and memory blocks comprise a group of memory cells, other organizations or groupings can also be used with the technology described herein.

FIG. 1C depicts one embodiment of memory core 103 in FIG. 1A. As depicted, memory core 103 includes memory bay 130 and memory bay 131. In some embodiments, the number of memory bays per memory core can be different for different implementations. For example, a memory core may include only a single memory bay or a plurality of memory bays (e.g., 16 memory bays or 256 memory bays).

FIG. 1D depicts one embodiment of memory bay 130 in FIG. 1C. As depicted, memory bay 130 includes memory blocks 110-112 and read/write circuits 156. In some embodiments, the number of memory blocks per memory bay may be different for different implementations. For example, a memory bay may include one or more memory blocks (e.g., 32 memory blocks per memory bay). Read/write circuits 156 include circuitry for reading and writing memory cells within memory blocks 110-112. As depicted, the read/write circuits 156 may be shared across multiple memory blocks within a memory bay. This allows chip area to be reduced since a single group of read/write circuits 156 may be used to support multiple memory blocks. However, in some embodiments, only a single memory block may be electrically coupled to read/write circuits 156 at a particular time to avoid signal conflicts.

In some embodiments, read/write circuits 156 may be used to write one or more pages of data into the memory blocks 110-112 (or into a subset of the memory blocks). The memory cells within the memory blocks 110-112 may permit direct over-writing of pages (i.e., data representing a page or a portion of a page may be written into the memory blocks 110-112 without requiring an erase or reset operation to be performed on the memory cells prior to writing the data). In one example, the memory system 101 in FIG. 1A may receive a write command including a target address and a set of data to be written to the target address. The memory system 101 may perform a read-before-write (RBW) operation to read the data currently stored at the target address before performing a write operation to write the set of data to the target address. The memory system 101 may then determine whether a particular memory cell may stay at its current state (i.e., the memory cell is already at the correct state), needs to be set to a "0" state, or needs to be reset to a "1" state. The memory system 101 may then write a first subset of the memory cells to the "0" state and then write a second subset of the memory cells to the "1" state. The memory cells that are already at the correct state may be skipped over, thereby improving programming speed and reducing the cumulative voltage stress applied to unselected memory cells. A particular memory cell may be set to the "1" state by applying a first voltage difference across the particular memory cell of a first polarity (e.g., +1.5V). The particular memory cell may be reset to the "0" state by applying a second voltage difference across the particular memory cell of a second polarity that is opposite to that of the first polarity (e.g., −1.5V).

In some cases, read/write circuits 156 may be used to program a particular memory cell to be in one of three or more data/resistance states (i.e., the particular memory cell may comprise a multi-level memory cell). In one example, the read/write circuits 156 may apply a first voltage difference (e.g., 2V) across the particular memory cell to program the particular memory cell into a first state of the three or more data/resistance states or a second voltage difference (e.g., 1V) across the particular memory cell that is less than the first voltage difference to program the particular memory cell into a second state of the three or more data/resistance states. Applying a smaller voltage difference across the particular memory cell may cause the particular memory cell to be partially programmed or programmed at a slower rate than when applying a larger voltage difference. In another example, the read/write circuits 156 may apply a first voltage difference across the particular memory cell for a first time period (e.g., 150 ns) to program the particular memory cell into a first state of the three or more data/resistance states or apply the first voltage difference across the particular memory cell for a second time period less than the first time period (e.g., 50 ns). One or more programming pulses followed by a memory cell verification phase may be used to program the particular memory cell to be in the correct state.

FIG. 1E depicts one embodiment of memory block 110 in FIG. 1D. As depicted, memory block 110 includes a memory array 151, row decoder 154, and column decoder 152. Memory array 151 may comprise a contiguous group of memory cells having contiguous word lines and bit lines. Memory array 151 may comprise one or more layers of memory cells. Memory array 151 may comprise a two-dimensional memory array or a three-dimensional memory array. The row decoder 154 decodes a row address and selects a particular word line in memory array 151 when appropriate (e.g., when reading or writing memory cells in memory array 151). The column decoder 152 decodes a column address and selects a particular group of bit lines in memory array 151 to be electrically coupled to read/write circuits, such as read/write circuits 156 in FIG. 1D. In one embodiment, the number of word lines is 4K per memory layer, the number of bit lines is 1K per memory layer, and the number of memory layers is 4, providing a memory array 151 containing 16M memory cells.

In one embodiment, memory array 151 may comprise memory cells that are oriented in a horizontal plane that is horizontal to the supporting substrate. In another embodiment, memory array 151 may comprise memory cells that are oriented in a vertical plane that is vertical with respect to the supporting substrate (i.e., the vertical plane is perpendicular to the supporting substrate). In this case, the bit lines of memory array 151 may comprise vertical bit lines.

Figure 2A:
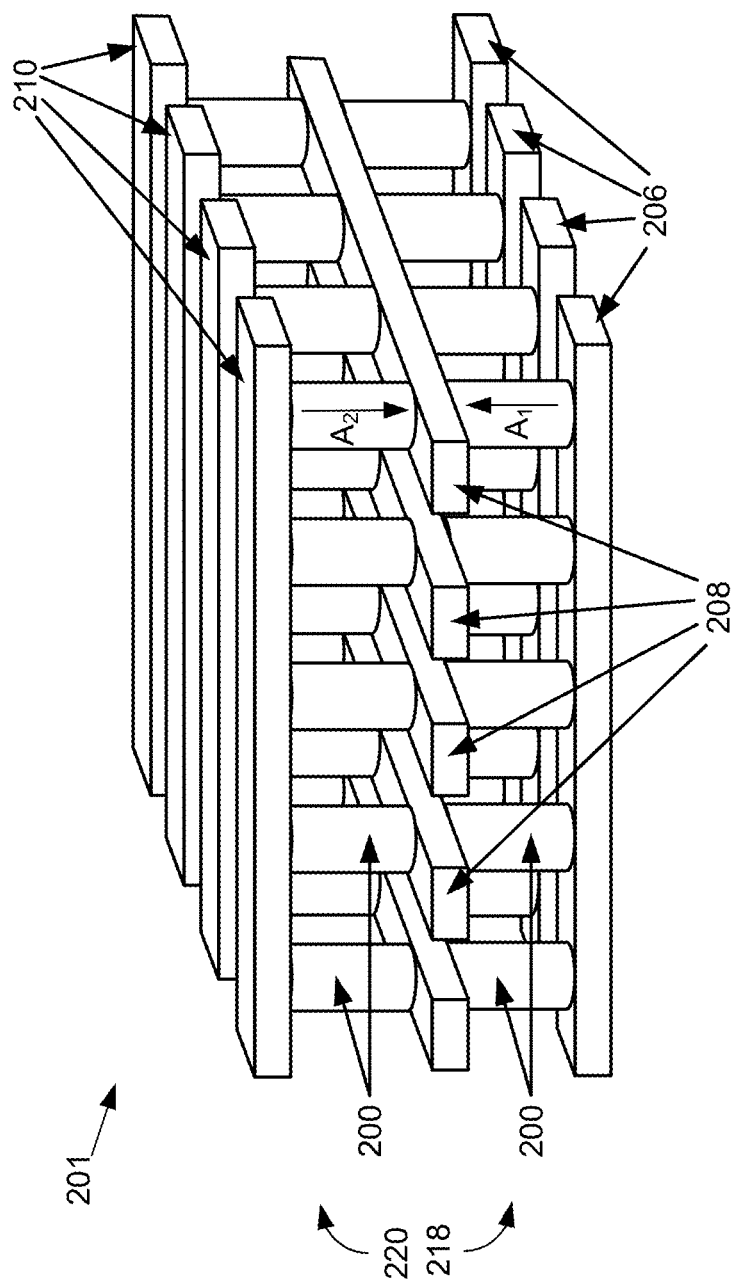
FIGS. 2A-2D depict various embodiments of a cross-point memory array.

FIG. 2A depicts one embodiment of a portion of a monolithic three-dimensional memory array 201 that includes a second memory level 220 positioned above a first memory level 218. Memory array 201 is one example of an implementation for memory array 151 in FIG. 1E. The bit lines 206 and 210 are arranged in a first direction and the word lines 208 are arranged in a second direction perpendicular to the first direction. As depicted, the upper conductors of first memory level 218 may be used as the lower conductors of the second memory level 220 that is positioned above the first memory level. In a memory array with additional layers of memory cells, there would be corresponding additional layers of bit lines and word lines.

As depicted in FIG. 2A, memory array 201 includes a plurality of memory cells 200. The memory cells 200 may include re-writeable memory cells. The memory cells 200 may include non-volatile memory cells or volatile memory cells. With respect to first memory level 218, a first portion of memory cells 200 are between and connect to bit lines 206 and word lines 208. With respect to second memory level 220, a second portion of memory cells 200 are between and connect to bit lines 210 and word lines 208. In one embodiment, each memory cell includes a steering element (e.g., a diode) and a memory element (i.e., a state change element). In one example, the diodes of the first memory level 218 may be upward pointing diodes as indicated by arrow $A_1$ (e.g., with p regions at the bottom of the diodes), while the diodes of the second memory level 220 may be downward pointing diodes as indicated by arrow $A_2$ (e.g., with n regions at the bottom of the diodes), or vice versa. In another embodiment, each memory cell includes a state change element and does not include a steering element. The absence of a diode (or other steering element) from a memory cell may reduce the process complexity and costs associated with manufacturing a memory array.

In one embodiment, the memory cells 200 of FIG. 2A may comprise re-writable non-volatile memory cells including a reversible resistance-switching element. A reversible resistance-switching element may include a reversible resistivity-switching material having a resistivity that may be reversibly switched between two or more states. In one embodiment, the reversible resistance-switching material may include a metal oxide (e.g., a binary metal oxide). The metal oxide may include nickel oxide or hafnium oxide. In another embodiment, the reversible resistance-switching material may include a phase change material. The phase change material may include a chalcogenide material. In some cases, the re-writeable non-volatile memory cells may comprise resistive RAM (ReRAM) devices.

In another embodiment, the memory cells 200 of FIG. 2A may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Referring to FIG. 2A, in one embodiment of a read operation, the data stored in one of the plurality of memory cells 200 may be read by biasing one of the word lines (i.e., the selected word line) to a selected word line voltage in read mode (e.g., 0V). A read circuit may then be used to bias a selected bit line connected to the selected memory cell to the selected bit line voltage in read mode (e.g., 1.0V). In some cases, in order to avoid sensing leakage current from the many unselected word lines to the selected bit line, the unselected word lines may be biased to the same voltage as the selected bit lines (e.g., 1.0V). To avoid leakage current from the selected word line to the unselected bit lines, the unselected bit lines may be biased to the same voltage as the selected word line (e.g., 0V); however, biasing the unselected word lines to the same voltage as the selected bit lines and biasing the unselected bit lines to the same voltage as the selected word line may place a substantial voltage stress across the unselected memory cells driven by both the unselected word lines and the unselected bit lines.

In an alternative read biasing scheme, both the unselected word lines and the unselected bit lines may be biased to an intermediate voltage that is between the selected word line voltage and the selected bit line voltage. Applying the same voltage to both the unselected word lines and the unselected bit lines may reduce the voltage stress across the unselected memory cells driven by both the unselected word lines and the unselected bit lines; however, the reduced voltage stress comes at the expense of increased leakage currents associated with the selected word line and the selected bit line. Before the selected word line voltage has been applied to the selected word line, the selected bit line voltage may be applied to the selected bit line, and a read circuit may then sense an auto zero amount of current through the selected memory bit line which is subtracted from the bit line current in a second current sensing when the selected word line voltage is applied to the selected word line. The leakage current may be subtracted out by using the auto zero current sensing.

Referring to FIG. 2A, in one embodiment of a write operation, the reversible resistance-switching material may be in an initial high-resistivity state that is switchable to a low-resistivity state upon application of a first voltage and/or current. Application of a second voltage and/or current may return the reversible resistance-switching material back to the high-resistivity state. Alternatively, the reversible resistance-switching material may be in an initial low-resistance state that is reversibly switchable to a high-resistance state upon application of the appropriate voltage(s) and/or current(s). When used in a memory cell, one resistance state may represent a binary data "0" while another resistance state may represent a binary data "1." In some cases, a memory cell may be considered to comprise more than two data/resistance states (i.e., a multi-level memory cell). In some cases, a write operation may be similar to a read operation except with a larger voltage range placed across the selected memory cells.

The process of switching the resistance of a reversible resistance-switching element from a high-resistivity state to a low-resistivity state may be referred to as SETTING the reversible resistance-switching element. The process of switching the resistance from the low-resistivity state to the high-resistivity state may be referred to as RESETTING the reversible resistance-switching element. The high-resistivity state may be associated with binary data "1" and the low-resistivity state may be associated with binary data "0." In other embodiments, SETTING and RESETTING operations and/or the data encoding may be reversed. For example, the high-resistivity state may be associated with binary data "0" and the low-resistivity state may be associated with binary data "1." In some embodiments, a higher than normal programming voltage may be required the first time a reversible resistance-switching element is SET into the low-resistivity state as the reversible resistance-switching element may have been placed into a resistance state that is higher than the high-resistivity state when fabricated. The term "FORMING" may refer to the setting of a reversible resistance-switching element into a low-resistivity state for the first time after fabrication or the resetting of a reversible resistance-switching element into a high-resistivity state for the first time after fabrication. In some cases, after a FORMING operation or a memory cell preconditioning operation has been performed, the reversible resistance-switching element may be RESET to the high-resistivity state and then SET again to the low-resistivity state.

Referring to FIG. 2A, in one embodiment of a write operation, data may be written to one of the plurality of memory cells 200 by biasing one of the word lines (i.e., the selected word line) to the selected word line voltage in write mode (e.g., 5V). A write circuit may be used to bias the bit line connected to the selected memory cell to the selected bit line voltage in write mode (e.g., 0V). In some cases, in order to prevent program disturb of unselected memory cells sharing the selected word line, the unselected bit lines may be biased such that a first voltage difference between the selected word line voltage and the unselected bit line voltage is less than a first disturb threshold. To prevent program disturb of unselected memory cells sharing the selected bit line, the unselected word lines may be biased such that a second voltage difference between the unselected word line voltage and the selected bit line voltage is less than a second disturb threshold. The first disturb threshold and the second disturb threshold may be different depending on the amount of time in which the unselected memory cells susceptible to disturb are stressed.

In one write biasing scheme, both the unselected word lines and the unselected bit lines may be biased to an intermediate voltage that is between the selected word line voltage and the selected bit line voltage. The intermediate voltage may be generated such that a first voltage difference across unselected memory cells sharing a selected word line is greater than a second voltage difference across other unselected memory cells sharing a selected bit line. One reason for placing the larger voltage difference across the unselected memory cells sharing a selected word line is that the memory cells sharing the selected word line may be verified immediately after a write operation in order to detect a write disturb.

Figure 2B:
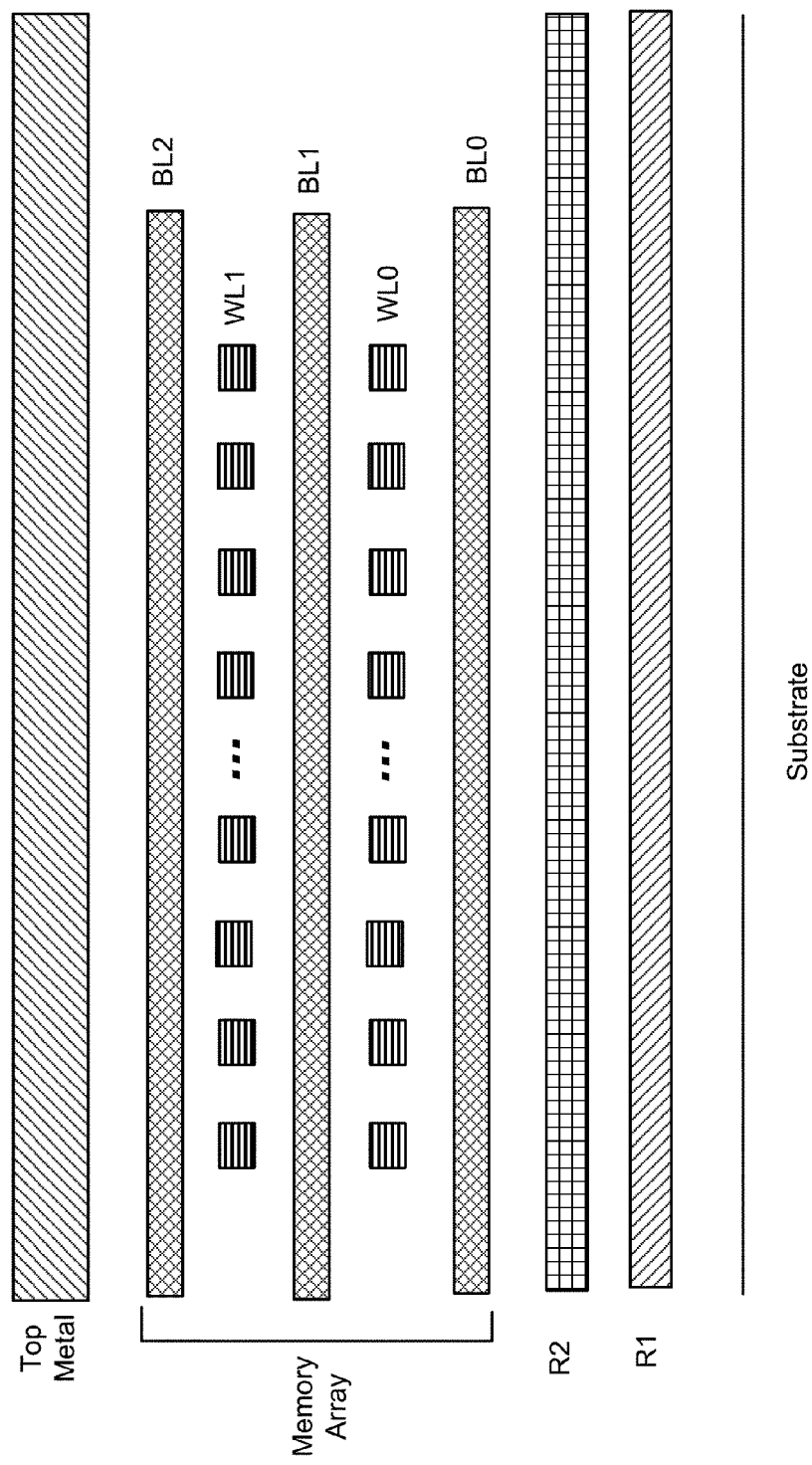

FIG. 2B depicts a subset of the memory array and routing layers of one embodiment of a three-dimensional memory array, such as memory array 151 in FIG. 1E. As depicted, the Memory Array layers are positioned above the Substrate. The Memory Array layers include bit line layers BL0, BL1 and BL2, and word line layers WL0 and WL1. In other embodiments, additional bit line and word line layers can also be implemented. Supporting circuitry (e.g., row decoders, column decoders, and read/write circuits) may be arranged on the surface of the Substrate with the Memory Array layers fabricated above the supporting circuitry. An integrated circuit implementing a three-dimensional memory array may also include multiple metal layers for routing signals between different components of the supporting circuitry, and between the supporting circuitry and the bit lines and word lines of the memory array. These routing layers can be arranged above the supporting circuitry that is implemented on the surface of the Substrate and below the Memory Array layers.

As depicted in FIG. 2B, two metal layers R1 and R2 may be used for routing layers; however, other embodiments can include more or less than two metal layers. In one example, these metal layers R1 and R2 may be formed of tungsten (about 1 ohm/square). Positioned above the Memory Array layers may be one or more top metal layers used for routing signals between different components of the integrated circuit, such as the Top Metal layer. In one example, the Top Metal layer is formed of copper or aluminum (about 0.05 ohms/square), which may provide a smaller resistance per unit area than metal layers R1 and R2. In some cases, metal layers R1 and R2 may not be implemented using the same materials as those used for the Top Metal layers because the metal used for R1 and R2 must be able to withstand the processing steps for fabricating the Memory Array layers on top of R1 and R2 (e.g., satisfying a particular thermal budget during fabrication).

Figure 2C:
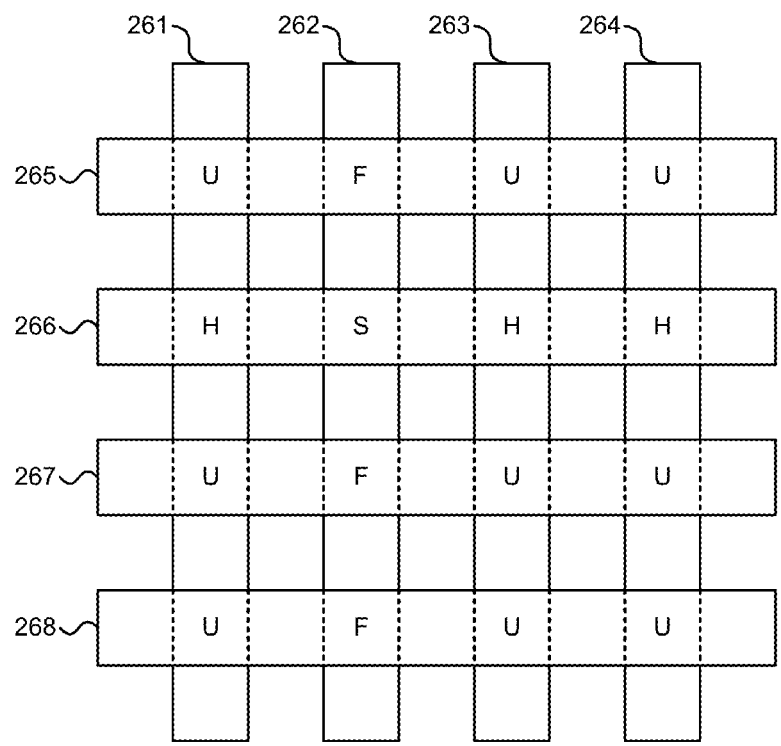

FIG. 2C depicts one embodiment of a cross-point memory array 260. In one example, the cross-point memory array 260 may correspond with memory array 201 in FIG. 2A. As depicted, cross-point memory array 260 includes word lines 265-268 and bit lines 261-264. The bit line 261 may comprise a vertical bit line or horizontal bit line. Word line 266 comprises a selected word line and bit line 262 comprises a selected bit line. At the intersection of selected word line 266 and selected bit line 262 is a selected memory cell (an S cell). The voltage across the S cell is the difference between the selected word line voltage and the selected bit line voltage. Memory cells at the intersections of the selected word line 266 and the unselected bit lines 261, 263, and 264 comprise unselected memory cells (H cells). H cells are unselected memory cells that share a selected word line that is biased to the selected word line voltage. The voltage across the H cells is the difference between the selected word line voltage and the unselected bit line voltage. Memory cells at the intersections of the selected bit line 262 and the unselected word lines 265, 267, and 268 comprise unselected memory cells (F cells). F cells are unselected memory cells that share a selected bit line that is biased to a selected bit line voltage. The voltage across the F cells is the difference between the unselected word line voltage and the selected bit line voltage. Memory cells at the intersections of the unselected word lines 265, 267, and 268 and the unselected bit lines 261, 263, and 264 comprise unselected memory cells (U cells). The voltage across the U cells is the difference between the unselected word line voltage and the unselected bit line voltage.

The number of F cells is related to the length of the bit lines (or the number of memory cells connected to a bit line) while the number of H cells is related to the length of the word lines (or the number of memory cells connected to a word line). The number of U cells is related to the product of the word line length and the bit line length. In one embodiment, each memory cell sharing a particular word line, such as word line 265, may be associated with a particular page stored within the cross-point memory array 260.

Figure 2D:
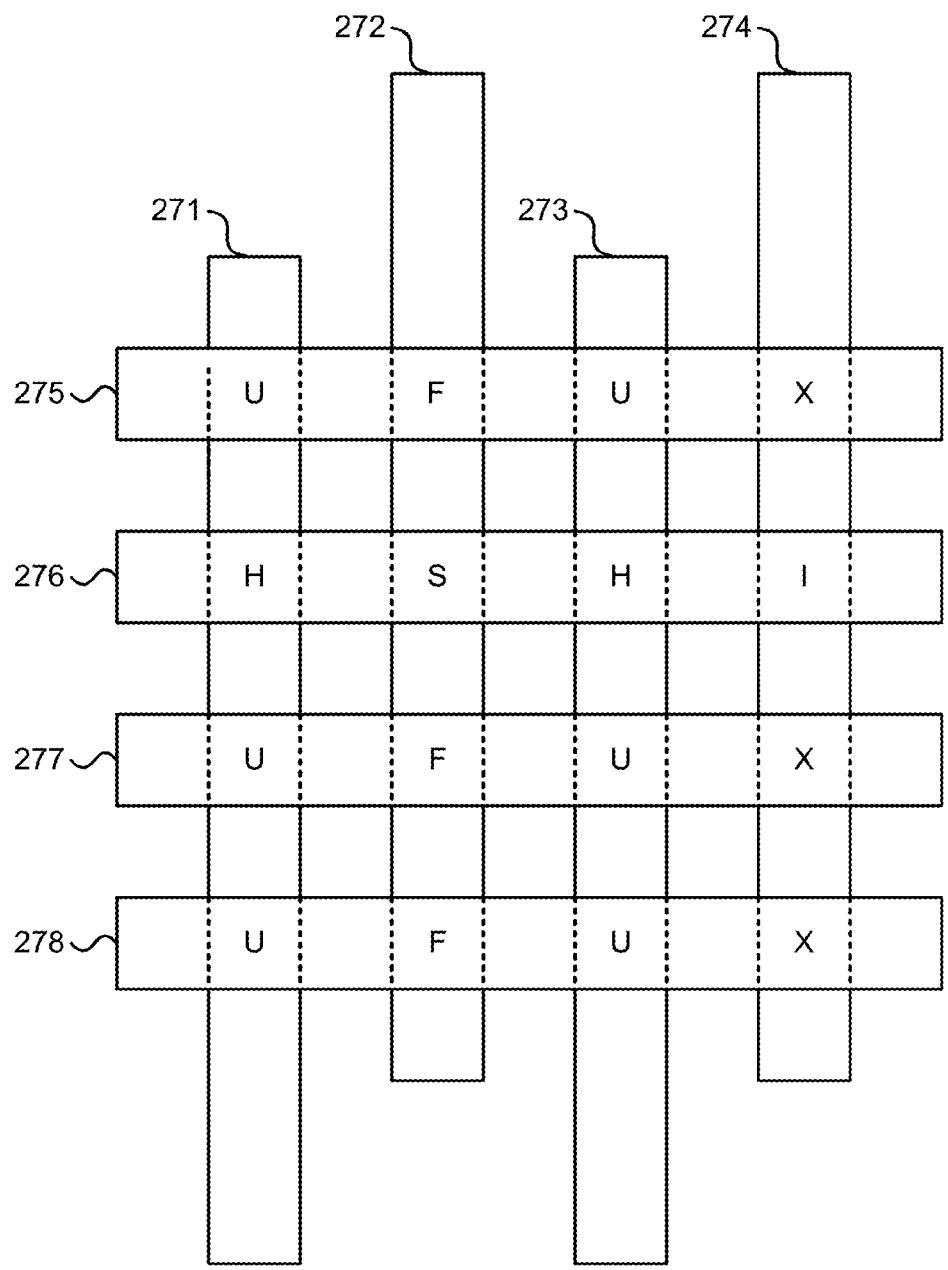

FIG. 2D depicts an alternative embodiment of a cross-point memory array 270. In one example, the cross-point memory array 270 may correspond with memory array 201 in FIG. 2A. As depicted, cross-point memory array 270 includes word lines 275-278 and bit lines 271-274. The bit line 271 may comprise a vertical bit line or horizontal bit line. Word line 276 comprises a selected word line and bit lines 272 and 274 comprise selected bit lines. Although both bit lines 272 and 274 are selected, the voltages applied to bit line 272 and bit line 274 may be different. For example, in the case that bit line 272 is associated with a first memory cell to be programmed (i.e., an S cell), then bit line 272 may be biased to a selected bit line voltage in order to program the first memory cell. In the case that bit line 274 is associated with a second memory cell that is not to be programmed (i.e., an I cell), then bit line 274 may be biased to a program inhibit voltage (i.e., to a bit line voltage that will prevent the second memory cell from being programmed).

At the intersection of selected word line 276 and selected bit line 274 is a program inhibited memory cell (an I cell). The voltage across the I cell is the difference between the selected word line voltage and the program inhibit voltage. Memory cells at the intersections of the selected bit line 274 and the unselected word lines 275, 277, and 278 comprise unselected memory cells (X cells). X cells are unselected memory cells that share a selected bit line that is biased to a program inhibit voltage. The voltage across the X cells is the difference between the unselected word line voltage and the program inhibit voltage. In one embodiment, the program inhibit voltage applied to the selected bit line 274 may be the same as or substantially the same as the unselected bit line voltage. In another embodiment, the program inhibit voltage may be a voltage that is greater than or less than the unselected bit line voltage. For example, the program inhibit voltage may be set to a voltage that is between the selected word line voltage and the unselected bit line voltage. In some cases, the program inhibit voltage applied may be a function of temperature. In one example, the program inhibit voltage may track the unselected bit line voltage over temperature.

In one embodiment, two or more pages may be associated with a particular word line. In one example, word line 275 may be associated with a first page and a second page. The first page may correspond with bit lines 271 and 273 and the second page may correspond with bit lines 272 and 274. In this case, the first page and the second page may correspond with interdigitated memory cells that share the same word line. When a memory array operation is being performed on the first page (e.g., a programming operation) and the selected word line 276 is biased to the selected word line voltage, one or more other pages also associated with the selected word line 276 may comprise H cells because the memory cells associated with the one or more other pages will share the same selected word line as the first page.

In some embodiments, not all unselected bit lines may be driven to an unselected bit line voltage. Instead, a number of unselected bit lines may be floated and indirectly biased via the unselected word lines. In this case, the memory cells of memory array 270 may comprise resistive memory elements without isolating diodes. In one embodiment, the bit lines 272 and 273 may comprise vertical bit lines in a three dimensional memory array comprising comb shaped word lines.

Figure 3A:
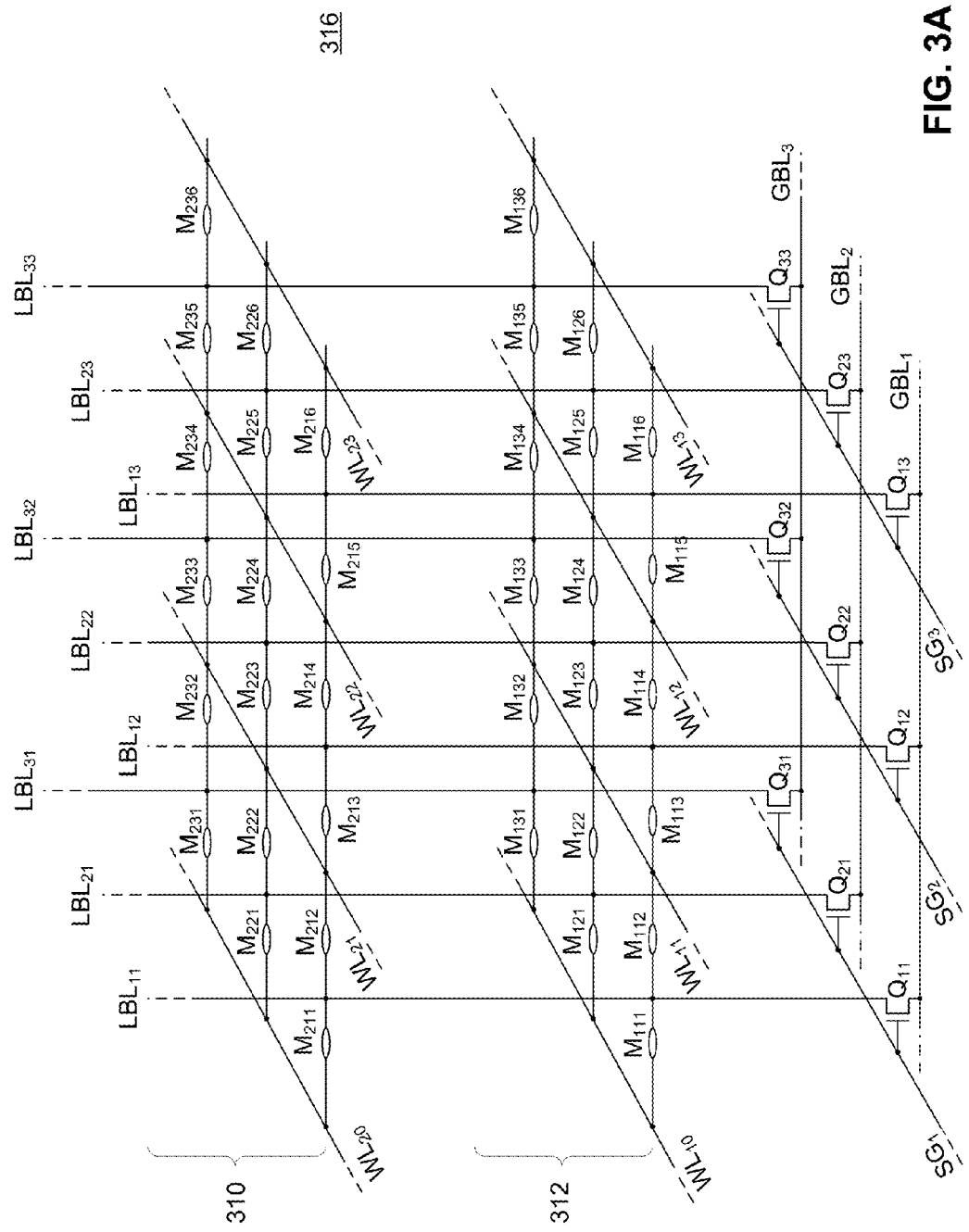

FIG. 3A depicts one embodiment of a portion of a monolithic three-dimensional memory array 316 that includes a first memory level 312 positioned below a second memory level 310. Memory array 316 is one example of an implementation for memory array 151 in FIG. 1E. As depicted, the local bit lines $LBL_{11}$-$LBL_{33}$ are arranged in a first direction (i.e., a vertical direction) and the word lines $WL_{10}$-$WL_{23}$ are arranged in a second direction perpendicular to the first direction. This arrangement of vertical bit lines in a monolithic three-dimensional memory array is one embodiment of a vertical bit line memory array. As depicted, disposed between the intersection of each local bit line and each word line is a particular memory cell (e.g., memory cell $M_{111}$ is disposed between local bit line $LBL_{11}$ and word line $WL_{10}$). In one example, the particular memory cell may include a floating gate device or a charge trap device (e.g., using a silicon nitride material). In another example, the particular memory cell may include a reversible resistance-switching material, a metal oxide, a phase change material, or a ReRAM material. The global bit lines $GBL_1$-$GBL_3$ are arranged in a third direction that is perpendicular to both the first direction and the second direction. A set of bit line select devices (e.g., $Q_{11}$-$Q_{31}$) may be used to select a set of local bit lines (e.g., $LBL_{11}$-$LBL_{31}$). As depicted, bit line select devices $Q_{11}$-$Q_{31}$ are used to select the local bit lines $LBL_{11}$-$LBL_{31}$ and to connect the local bit lines $LBL_{11}$-$LBL_{31}$ to the global bit lines $GBL_1$-$GBL_3$ using row select line $SG_1$. Similarly, bit line select devices $Q_{12}$-$Q_{32}$ are used to selectively connect the local bit lines $LBL_{12}$-$LBL_{32}$ to the global bit lines $GBL_1$-$GBL_3$ using row select line $SG_2$ and bit line select devices $Q_{13}$-$Q_{33}$ are used to selectively connect the local bit lines $LBL_{13}$-$LBL_{33}$ to the global bit lines $GBL_1$-$GBL_3$ using row select line $SG_3$.

Referring to FIG. 3A, as only a single bit line select device is used per local bit line, only the voltage of a particular global bit line may be applied to a corresponding local bit line. Therefore, when a first set of local bit lines (e.g., $LBL_{11}$-$LBL_{31}$) is biased to the global bit lines $GBL_1$-$GBL_3$, the other local bit lines (e.g., $LBL_{12}$-$LBL_{32}$ and $LBL_{13}$-$LBL_{33}$) must either also be driven to the same global bit lines $GBL_1$-$GBL_3$ or be floated. In one embodiment, during a memory operation, all local bit lines within the memory array are first biased to an unselected bit line voltage by connecting each of the global bit lines to one or more local bit lines. After the local bit lines are biased to the unselected bit line voltage, then only a first set of local bit lines $LBL_{11}$-$LBL_{31}$ are biased to one or more selected bit line voltages via the global bit lines $GBL_1$-$GBL_3$, while the other local bit lines (e.g., $LBL_{12}$-$LBL_{32}$ and $LBL_{13}$-$LBL_{33}$) are floated. The one or more selected bit line voltages may correspond with, for example, one or more read voltages during a read operation or one or more programming voltages during a programming operation.

In one embodiment, a vertical bit line memory array, such as memory array 316, includes a greater number of memory cells along the word lines as compared with the number of memory cells along the vertical bit lines (e.g., the number of memory cells along a word line may be more than 10 times the number of memory cells along a bit line). In one example, the number of memory cells along each bit line may be 16 or 32, while the number of memory cells along each word line may be 2048 or more than 4096.

Figure 3B:
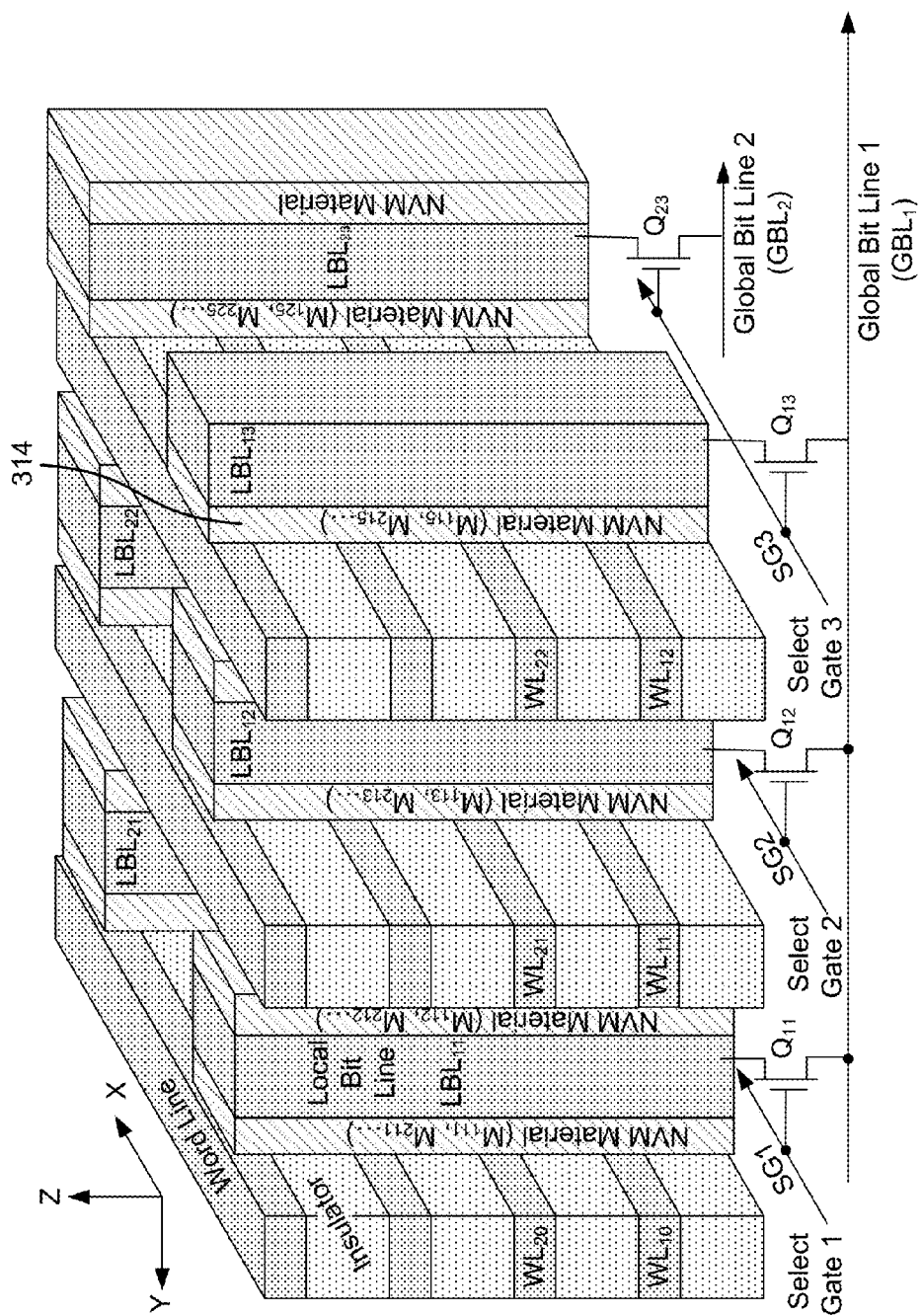

FIG. 3B depicts one embodiment of a portion of a monolithic three-dimensional memory array that includes vertical strips of a non-volatile memory material. The physical structure depicted in FIG. 3B may comprise one implementation for a portion of the monolithic three-dimensional memory array depicted in FIG. 3A. The vertical strips of non-volatile memory material may be formed in a direction that is perpendicular to a substrate (e.g., in the Z direction). A vertical strip of the non-volatile memory material 314 may include, for example, a vertical oxide layer, a vertical metal oxide layer (e.g., nickel oxide or hafnium oxide), a vertical layer of phase change material, or a vertical charge trapping layer (e.g., a layer of silicon nitride). The vertical strip of material may comprise a single continuous layer of material that may be used by a plurality of memory cells or devices. In one example, portions of the vertical strip of the non-volatile memory material 314 may comprise a part of a first memory cell associated with the cross section between $WL_{12}$ and $LBL_{13}$ and a part of a second memory cell associated with the cross section between $WL_{22}$ and $LBL_{13}$. In some cases, a vertical bit line, such as $LBL_{13}$, may comprise a vertical structure (e.g., a rectangular prism, a cylinder, or a pillar) and the non-volatile material may completely or partially surround the vertical structure (e.g., a conformal layer of phase change material surrounding the sides of the vertical structure). As depicted, each of the vertical bit lines may be connected to one of a set of global bit lines via a select transistor. The select transistor may comprise a MOS device (e.g., an NMOS device) or a vertical thin-film transistor (TFT).

FIG. 3C depicts a cross-sectional view of a memory structure using the vertically oriented select devices shown in FIG. 3B. The memory structure of FIG. 3C may comprise a continuous mesh array of memory elements because there are memory elements connected to both sides of the bit lines and memory elements connected to both sides of the word lines. At the bottom of FIG. 3C, a silicon substrate is depicted. Implemented above the surface of the silicon substrate are various metal lines including ML-0, ML-1, and ML-2. Line 526 of ML-2 serves as a respective global bit line (GBL). The Pillar Select Layer includes two oxide layers 520 with a gate material layer 522 sandwiched there between. The oxide layers 520 can be $SiO_2$. The metal line ML-2 526 serving as a global bit line can be implemented of any suitable material, including Tungsten, or Tungsten on a Titanium Nitride adhesion layer or a sandwich of n+ polysilicon on Tungsten on Titanium Nitride adhesion layer. Gate material 522 can be polysilicon, Titanium Nitride, Tantalum Nitride, Nickel Silicide or any other suitable material. Gate material 522 implements the row select lines $SG_x$ (e.g. $SG_1$, $SG_2$, ... of FIG. 3B), which are labeled in FIG. 3C as row select lines 580, 582, 584, 586, 588 and 590.

The memory layer includes a set of vertical bit lines 530 (comprising N+ polysilicon). Interspersed between the vertical bit lines 530 are alternating oxide layers 534 and word line layers 536. In one embodiment, the word lines are made from TiN. Between the vertical bit lines 530 and the stacks of alternating oxide layers 536 and word line layers 536 are vertically oriented layers of reversible resistance switching material 532. In one embodiment the reversible resistance switching material is made of Hafnium Oxide $HfO_2$. In another embodiment, the reversible resistance switching material 532 may include a layer of amorphous silicon (e.g., a Si barrier layer) and a layer titanium oxide (e.g., a TiO2 switching layer). Box 540 depicts one example memory element which includes the reversible resistance switching material 532 sandwiched between a word line 536 and vertical bit line 530. Directly below each vertical bit line 530 are the vertically oriented select devices 504, each of which comprises (in one example embodiment) a n+/p−/n+ TFT. Each of the vertically oriented select devices 504 have oxide layers 505 on each side. FIG. 3C also shows an n+ polysilicon layer 524. As depicted, the npn TFT of vertically oriented select devices 504 can be used to connect the global bit line GBL (layer 526) with any of the vertical bit lines 530.

Moreover, FIG. 3C shows six row select lines ($SG_x$) 580, 582, 584, 586, 588 and 590 in the gate material layer 522, each underneath a stack of multiple word lines. Each of the row select lines 580, 582, 584, 586, 588 and 590 is positioned between two vertically oriented select devices 504, above and not in the substrate. Each row select line may serve as the gate signal to either of the two neighboring vertically oriented select devices 504; therefore, the vertically oriented select devices 504 are said to be double gated. Each vertically oriented select device 504 can be controlled by two different row select lines, in this embodiment. One aspect of the vertically oriented select devices incorporated to the base portion of each bit line pillar is that two adjacent vertically oriented select devices share the same gate region, which may allow the vertically oriented select devices to be closer together.

In some embodiments, a portion of a memory array may be formed by first etching through an alternating stack of word line layers and dielectric layers (e.g., etching through layers of TiN or polysilicon that are separated by oxide layers) to form a plurality of memory holes. The plurality of memory holes may comprise rectangular, square, or cylindrical holes. The plurality of memory holes may be formed by patterning and then removing material using various etching techniques such as dry etching, wet chemical etching, plasma etching, or reactive-ion etching (RIE). After the plurality of memory holes have been created, the layers for forming vertical pillars within the plurality of memory holes may be deposited. The layers of the vertical pillars may be deposited using various deposition techniques such as chemical vapor deposition (CVD), physical vapor deposition (PVD), or atomic layer deposition (ALD).

Figure 4A:
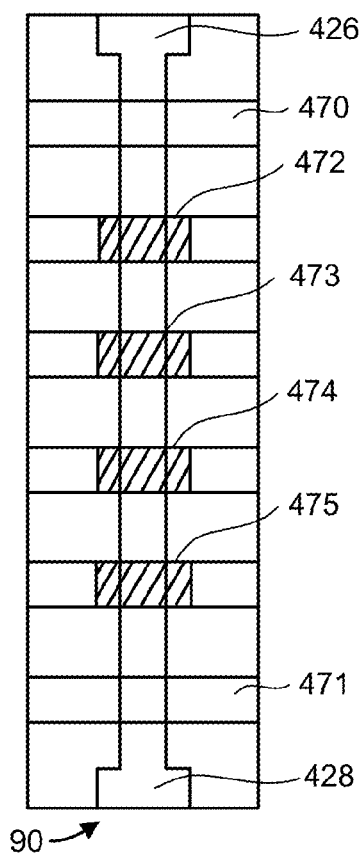
FIG. 4A depicts one embodiment of a NAND string.
Figure 4B:
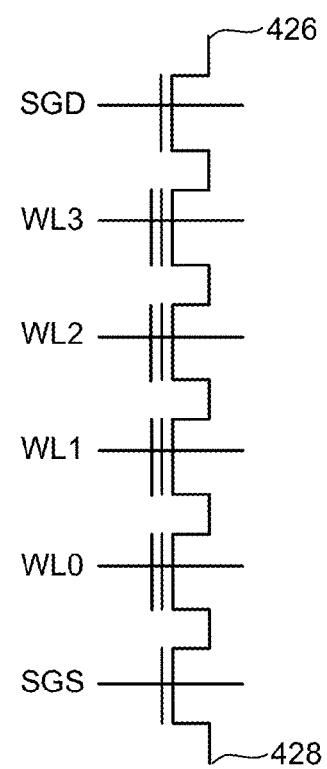
FIG. 4B depicts one embodiment of the NAND string of FIG. 4A using a corresponding circuit diagram.

FIG. 4A depicts one embodiment of a NAND string 90. FIG. 4B depicts one embodiment of the NAND string of FIG. 4A using a corresponding circuit diagram. As depicted, NAND string 90 includes four transistors 472-475 in series between a first select gate 470 (i.e., a drain-side select gate) and a second select gate 471 (i.e., a source-side select gate). Select gate 470 connects the NAND string 90 to a bit line 426 and is controlled by applying the appropriate voltage to the select line SGD. In this case, the bit line 426 is directly connected to the drain side end of the NAND string. Select gate 471 connects the NAND string 90 to a source line 428 and is controlled by applying the appropriate voltage to the select line SGS. In this case, the source line 428 is directly connected to the source-side end of the NAND string 90. The gates of transistors 472-475 are connected to word lines WL3, WL2, WL1, and WL0, respectively.

Note that although FIGS. 4A-4B show four floating-gate transistors in the NAND string, the use of four floating-gate transistors is only provided as an example. A NAND string may have less than or more than four floating-gate transistors (or memory cells). For example, some NAND strings may include 16 memory cells, 32 memory cells, 64 memory cells, 128 memory cells, etc. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system using a NAND flash memory structure includes a plurality of NAND strings within a memory block. A memory block may comprise a unit of erase. In some cases, the NAND strings within a memory block may share a common well (e.g., a p-well). Each NAND string may be connected to a common source line by its source-side select gate (e.g., controlled by select line SGS) and connected to its associated bit line by its drain-side select gate (e.g., controlled by select line SGD). Typically, each bit line runs on top of (or over) its associated NAND string in a direction perpendicular to the word lines and is connected to a sense amplifier.

In some embodiments, during a programming operation, storage elements that are not to be programmed (e.g., storage elements that have previously completed programming to a target data state) may be inhibited or locked out from programming by boosting associated channel regions (e.g., self-boosting the channel regions via word line coupling). An unselected storage element (or unselected NAND string) may be referred to as an inhibited or locked out storage element (or inhibited NAND string) as it is inhibited or locked out from programming during a given programming iteration of a programming operation.

Although technology using NAND-type flash memory may be described herein, the technology disclosed herein may also be applied to other types of non-volatile storage devices and architectures (e.g., NOR-type flash memory). Moreover, although technology using floating-gate transistors is described herein, the technology described herein may also be applied to or used with other memory technologies including those that employ charge trapping, phase-change (e.g., chalcogenide materials), or state-change materials.

Figure 4C:
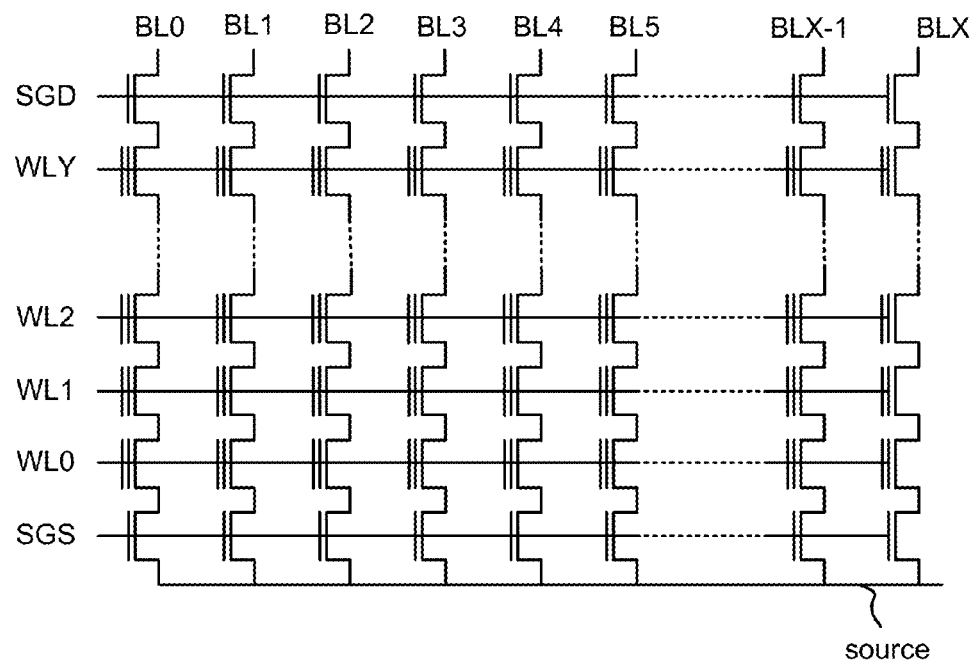
FIG. 4C depicts one embodiment of a memory block including a plurality of NAND strings.

FIG. 4C depicts one embodiment of a memory block including a plurality of NAND strings. As depicted, each NAND string includes (Y+1) memory cells. Each NAND string is connected to one bit line out of (X+1) bit lines on the drain side (i.e., one bit line of bit lines BL0-BLX) via a drain-side select gate controlled by the drain-side selection signal SGD. Each NAND string is connected to a source line (source) via a source-side select gate controlled by source-side selection signal SGS. In one embodiment, the source-side select gate controlled by source-side selection signal SGS and the drain-side select gate controlled by the drain-side selection signal SGD may comprise transistors without floating gates or transistors that include a floating gate structure.

In one embodiment, during a programming operation, when programming a memory cell, such as a NAND flash memory cell, a program voltage may be applied to the control gate of the memory cell and the corresponding bit line may be grounded. These programming bias conditions may cause electrons to be injected into the floating gate via field-assisted electron tunneling, thereby raising the threshold voltage of the memory cell. The program voltage applied to the control gate during a program operation may be applied as a series of pulses. In some cases, the magnitude of the programming pulses may be increased with each successive pulse by a predetermined step size. Between programming pulses, one or more verify operations may be performed. During the programming operation, memory cells that have reached their intended programming states may be locked out and inhibited from programming by boosting the channel regions of the program inhibited memory cells.

In some embodiments, during verify operations and/or read operations, a selected word line may be connected (or biased) to a voltage, a level of which is specified for each read and verify operation in order to determine whether a threshold voltage of a particular memory cell has reached such level. After applying the word line voltage, the conduction current of the memory cell may be measured (or sensed) to determine whether the memory cell conducted a sufficient amount of current in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are several ways to measure the conduction current of a memory cell during a read or verify operation. In one example, the conduction current of a memory cell may be measured by the rate it discharges or charges a dedicated capacitor in a sense amplifier. In another example, the conduction current of the selected memory cell allows (or fails to allow) the NAND string that included the memory cell to discharge a voltage on the corresponding bit line. The voltage of the bit line (or the voltage across a dedicated capacitor in a sense amplifier) may be measured after a period of time to determine whether the bit line has been discharged by a particular amount or not.

In some cases, during a read operation or a sensing operation, the source-side selection signal SGS may be set to a particular voltage (e.g., 7V or 10V) to pass the voltage applied to the source line (source) to the source junction of the floating gate transistors whose gates are connected to WL0 or the word line closest to the source-side select gate.

Figure 4D:
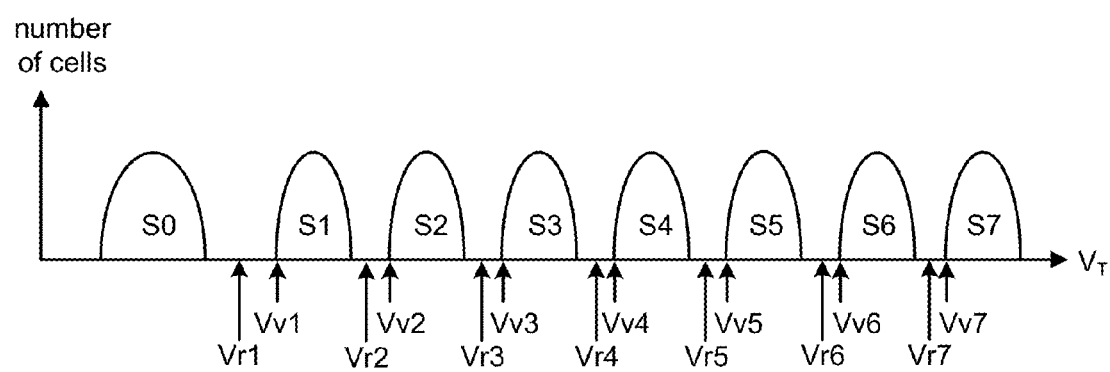
FIG. 4D depicts one embodiment of possible threshold voltage distributions for a three-bit-per-cell memory cell.

FIG. 4D depicts one embodiment of possible threshold voltage distributions (or data states) for a three-bit-per-cell memory cell (i.e., the memory cell may store three bits of data). Other embodiments, however, may use more than or less than three bits of data per memory cell (e.g., such as four or more bits of data per memory cell). At the end of a successful programming process (with verification), the threshold voltages of memory cells within a memory page or memory block should be within one or more threshold voltage distributions for programmed memory cells or within a distribution of threshold voltages for erased memory cells, as appropriate.

As depicted, each memory cell may store three bits of data; therefore, there are eight valid data states S0-S7. In one embodiment, data state S0 is below 0 volts and data states S1-S7 are above 0 volts. In other embodiments, all eight data states are above 0 volts, or other arrangements can be implemented. In one embodiment, the threshold voltage distribution S0 is wider than distributions S1-S7.

Each data state S0-S7 corresponds to a unique value for the three bits stored in the memory cell. In one embodiment, S0=111, S1=110, S2=101, S3=100, S4=011, S5=010, S6=001 and S7=000. Other mappings of data to states S0-S7 can also be used. In one embodiment, all of the bits of data stored in a memory cell are stored in the same logical page. In other embodiments, each bit of data stored in a memory cell corresponds to different pages. Thus, a memory cell storing three bits of data would include data in a first page, a second page, and a third page. In some embodiments, all of the memory cells connected to the same word line would store data in the same three pages of data. In some embodiments, the memory cells connected to a word line can be grouped into different sets of pages (e.g., by odd and even bit lines).

In some example implementations, the memory cells will be erased to state S0. From state S0, the memory cells can be programmed to any of states S1-S7. Programming may be performed by applying a set of pulses with rising magnitudes to the control gates of the memory cells. Between pulses, a set of verify operations may be performed to determine whether the memory cells being programmed have reached their target threshold voltage (e.g., using verify levels Vv1, Vv2, Vv3, Vv4, Vv5, Vv6, and Vv7). Memory cells being programmed to state S1 will be tested to see if their threshold voltage has reached Vv1. Memory cells being programmed to state S2 will be tested to see if their threshold voltage has reached Vv2. Memory cells being programmed to state S3 will be tested to see if their threshold voltage has reached Vv3. Memory cells being programmed to state S4 will be tested to see if their threshold voltage has reached Vv4. Memory cells being programmed to state S5 will be tested to see if their threshold voltage has reached Vv5. Memory cells being programmed to state S6 will be tested to see if their threshold voltage has reached Vv6. Memory cells being programmed to state S7 will be tested to see if their threshold voltage has reached Vv7.

When reading memory cells that store three bits of data, multiple reads will be performed at read compare points Vr1, Vr2, Vr3, Vr4, Vr5, Vr6, and Vr7 to determine which state the memory cells are in. If a memory cell turns on in response to Vr1, then it is in state S0. If a memory cell turns on in response to Vr2 but does not turn on in response to Vr1, then it is in state S1. If a memory cell turns on in response to Vr3 but does not turn on in response to Vr2, then it is in state S2. If a memory cell turns on in response to Vr4 but does not turn on in response to Vr3, then it is in state S3. If a memory cell turns on in response to Vr5 but does not turn on in response to Vr4, then it is in state S4. If a memory cell turns on in response to Vr6 but does not turn on in response to Vr5, then it is in state S5. If a memory cell turns on in response to Vr7 but does not turn on in response to Vr6, then it is in state S6. If a memory cell does not turn on in response to Vr7, then it is in state S7.

FIG. 4E depicts a top view of U-shaped NAND strings that are part of a memory block 400. The block 400 may include NAND string sub-blocks NS-SB0 to NS-SB5. Block 400 may comprise one example implementation of memory block 110 in FIG. 1D. The top view depicts a representative word line layer among multiple word line layers in a stack that includes alternating dielectric and conductive layers. The conductive layers may include doped polysilicon or metal silicide and the dielectric layers may include silicon dioxide. The word line layer is divided into two portions (or planes) 402 and 404. Each word line layer portion can be considered to be a word line, and is connected to control gates of associated memory cells.

Each block includes a slit pattern. A slit may refer to a void which extends vertically in the stack, typically from an etch stop layer at the bottom to at least a top layer of the stack. A slit 406 is a single continuous slit which extends in a zig-zag pattern in the block so that the block is divided into the two portions 402 and 404 that are insulated from one another. This approach can provide greater flexibility in controlling the memory cells since the two word line layer portions can be driven independently at each layer or height in the stack. Each block includes rows of vertical memory holes or pillars, represented by circles. The memory holes extend vertically in the stack and include memory cells such as in a vertical NAND string. An example column of memory cells along a line 420 includes C0D to C5D (D denotes a drain side column and S denotes a source side column).

FIG. 4F depicts the block 400 in FIG. 4E showing example word line subsets WL3D-SB and WL3S-SB and example bit line subsets BL-SB0 and BL-SB1. WL3S-SB is a portion of a word line layer (e.g., the third word line layer) connected to one memory cell in the source-side of each U-shaped NAND string, and WL3D-SB is a portion of the word line layer connected to one memory cell in the drain-side of each U-shaped NAND string. When U-shaped NAND strings (or pipe-shaped NAND strings) are used, each NAND string sub-block can include two adjacent rows of columns of memory cells. In the sub-block, the adjacent rows are separated by the slit. The columns of memory cells on one side of the slit are drain-side columns (e.g., C0D, C1D, C2D and C3D in FIG. 4E) of NAND strings, and the columns of memory cells on the other side of the slit are source-side columns (e.g., C0S, C1S, C2S and C3S in FIG. 4E) of the NAND strings. Word line drivers can independently provide signals such as voltage waveforms to the word line layer portions 402 and 404.

Figure 4G:
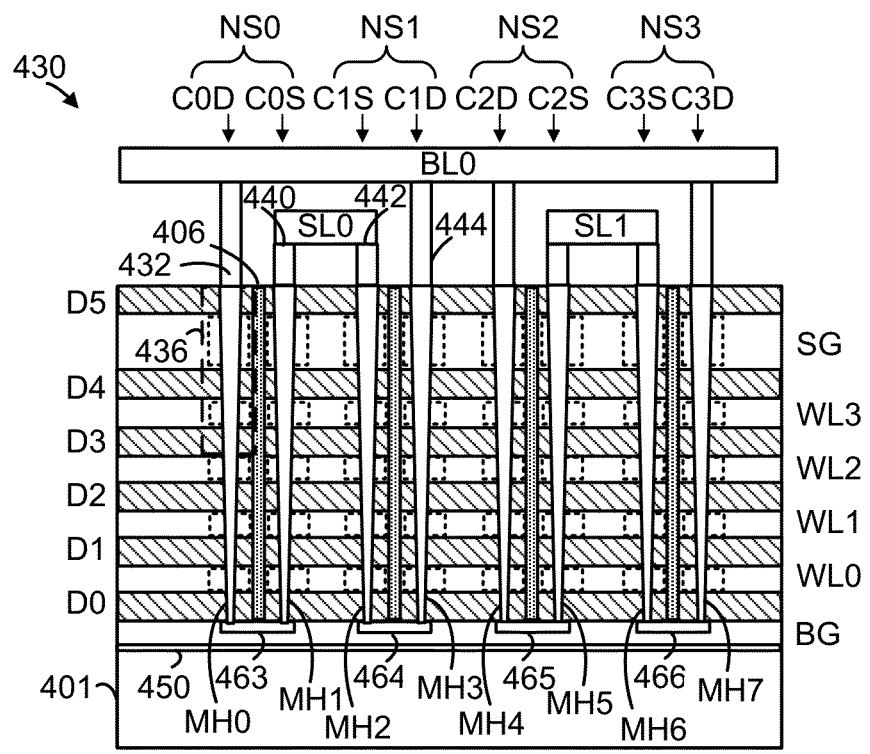

FIG. 4G depicts a cross-sectional view of the portion 410 of the block 400 of FIG. 4E along line 420. Columns of memory cells are depicted in the multi-layer stack. The portion 410 includes the substrate 401, an insulating film 450 on the substrate, and a back gate layer BG, which is a conductive layer on the insulating film. A trench is provided in portions of the back gate below pairs of columns of memory cells of a U-shaped NAND string. Layers of materials which are provided in the columns to form the memory cells are also provided in the trenches, and the remaining space in the trenches is filled with a semiconductor material to provide connecting portions 463 to 466 which connect the columns. The back gate connects the two columns of each U-shaped NAND string. For example, NS0 (NS=NAND string) includes columns C0D and C0S and connecting portion 463 and has a drain end 432 and a source end 440. NS1 includes columns C1S and CM and connecting portion 464 and has a drain end 444 and a source end 442. NS2 includes columns C2D and C2S and connecting portion 465. NS3 includes columns C3S and C3D and connecting portion 466. The source line SL0 is connected to the source ends 440 and 442 of two adjacent memory strings NS0 and NS1. Additional U-shaped NAND strings in the stack 430 may extend behind the U-shaped NAND strings depicted in the cross-section. The U-shaped NAND strings NS0-NS3 are each in a different NAND string sub-block, but are in a common BL subset. The bit line BL0 connects to the drain ends 432 and 444. Memory holes MH0-MH7 are depicted extending vertically in the stack and correspond with respective memory holes for the memory cells of the NAND strings.

Figure 4H:
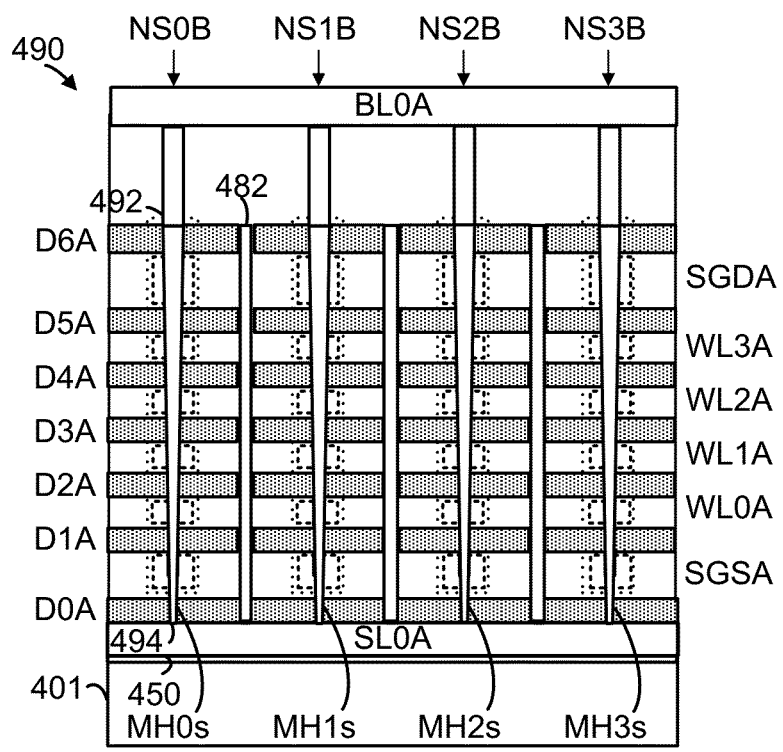
Figure 4I:
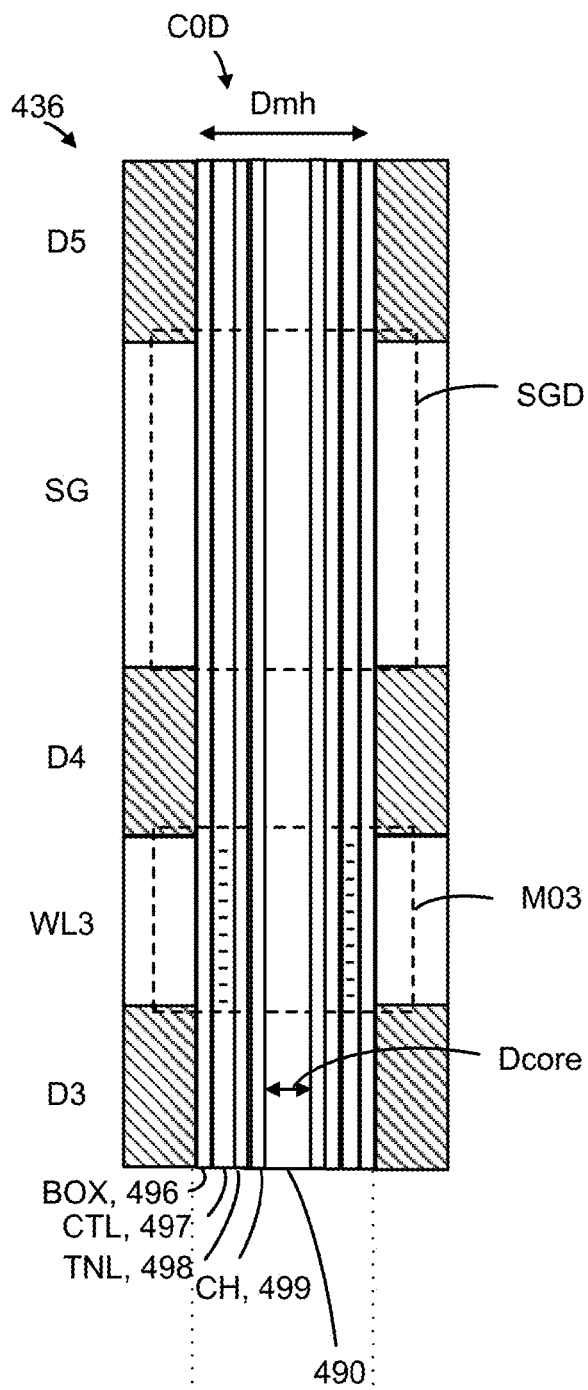

FIG. 4I depicts a close-up view of the region 436 of the column C0D of FIG. 4G, showing a drain-side select gate transistor SGD and a memory cell M03. The region also shows portions of the dielectric layers D3, D4 and D5. Each column includes a number of layers which are deposited along the sidewalls of the column. These layers can include oxide-nitride-oxide (O—N—O) and polysilicon layers which are deposited, e.g., using atomic layer deposition. For example, a block oxide (BOX) can be deposited as layer 496, a nitride such as SiN as a charge trapping layer (CTL) can be deposited as layer 497 and a tunnel oxide (TNL) can be deposited as layer 498, to provide the O—N—O layers. Further, a polysilicon body or channel (CH) can be deposited as layer 499, and a core filler dielectric can be deposited as region 490. Additional memory cells may be similarly formed throughout the columns. Dmh represents the memory hole diameter and Dcore represents the core diameter, which can both vary along the length or longitudinal axis of the memory hole. When a memory cell is programmed, electrons are stored in a portion of the charge trapping layer which is associated with the memory cell. For example, electrons are represented by "-" symbols in the CTL 497 for the memory cell M03.

Figure 4J:
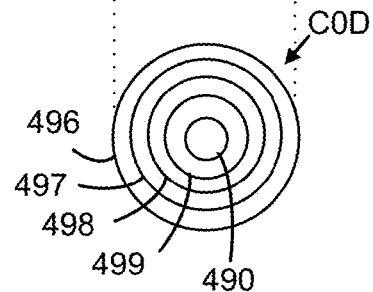

FIG. 4J depicts a cross-sectional view of the column C0D of FIG. 4I. In some cases, each layer may be ring-shaped except for the core filler, which may be a tapered cylinder.

FIG. 4H depicts a cross-sectional view of a single vertical NAND string architecture. As depicted, vertical strings of memory cells corresponding with NAND strings NS0B, NS1B, NS2B and NS3B are depicted in the multi-layer stack 490. The stack 490 includes a substrate 401, an insulating film 450 on the substrate, and a portion of a source line SL0A arranged above the insulating film 450. NAND string NS0B has a source end 494 and a drain end 492. A portion of a bit line BL0A is also depicted. Dashed lines depict memory cells and select gate transistors. Memory holes MH0s, MH1s, MH2s and MH3s are associated with NAND strings NS0B, NS1B, NS2B and NS3B. Word line layers are WL0A, WL1A, WL2A and WL3A. Dielectric layers are D0A, D1A, D2A, D3A, D4A, D5A and D6A. SGSA is a source-side select gate layer and SGDA is a drain-side select gate layer. As depicted, in contrast to U-shaped NAND strings in which the source lines and bit lines connect to the U-shaped NAND strings at the top of the NAND strings, with single vertical NAND strings the bit lines connect to the vertical NAND strings at the top of the NAND strings and the source lines connect to the vertical NAND strings at the bottom of the NAND strings.

Figure 5:
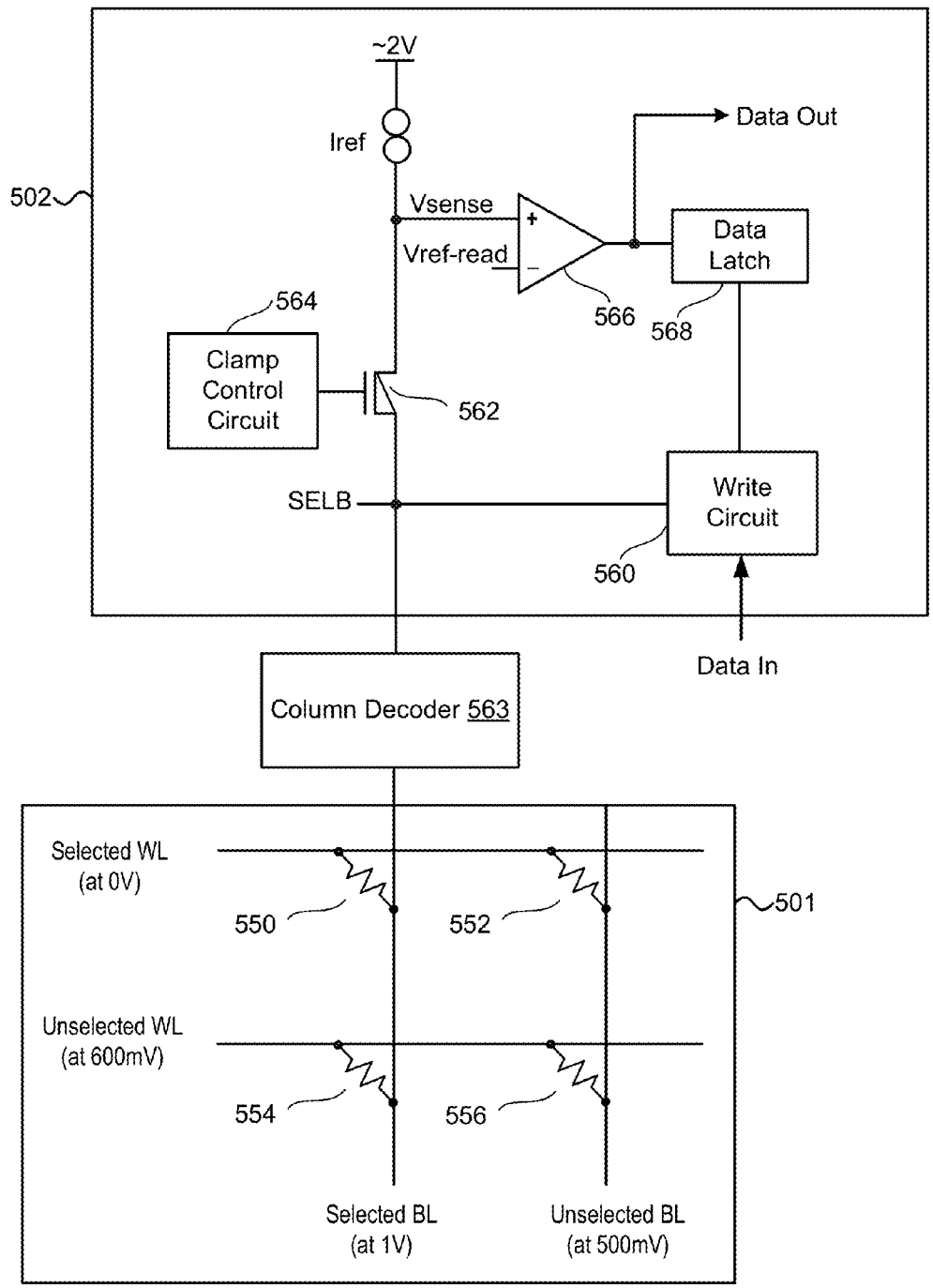
FIG. 5 depicts one embodiment of a read/write circuit.

FIG. 5 depicts one embodiment of a read/write circuit 502 along with a portion of a memory array 501. Read/write circuit 502 is one example of an implementation of read/write circuit 156 in FIG. 1D. The portion of a memory array 501 includes two of the many bit lines (one selected bit line labeled "Selected BL" and one unselected bit line labeled "Unselected BL") and two of the many word lines (one selected word line labeled "Selected WL" and one unselected word line labeled "Unselected WL"). The portion of a memory array also includes a selected memory cell 550 and unselected memory cells 552-556. In one embodiment, the portion of a memory array 501 may comprise a memory array with bit lines arranged in a direction horizontal to the substrate, such as memory array 201 in FIG. 2A. In another embodiment, the portion of a memory array 501 may comprise a memory array with bit lines arranged in a vertical direction that is perpendicular to the substrate, such as memory array 316 in FIG. 3A.

As depicted, during a memory array operation (e.g., a programming operation), the selected bit line may be biased to 1V, the unselected word line may be biased to 0.6V, the selected word line may be biased to 0V, and the unselected bit line may be biased to 0.5V. In some embodiments, during a second memory array operation, the selected bit line may be biased to a selected bit line voltage (e.g., 2.0V), the unselected word line may be biased to an unselected word line voltage (e.g., 1.0V), the selected word line may be biased to a selected word line voltage (e.g., 0V), and the unselected bit line may be biased to an unselected bit line voltage (e.g., 1V). In this case, the unselected memory cells sharing the selected word line will be biased to the voltage difference between the selected word line voltage and the unselected bit line voltage. In other embodiments, the memory array biasing scheme depicted in FIG. 5 may be reversed such that the selected bit line is biased to 0V, the unselected word line is biased to 0.4V, the selected word line is biased to 1V, and the unselected bit line is biased to 0.5V.

As depicted in FIG. 5, the SELB node of read/write circuit 502 may be electrically coupled to the selected bit line via column decoder 563. In one embodiment, column decoder 563 may correspond with column decoder 152 depicted in FIG. 1E. Transistor 562 couples (or electrically connects) node SELB to the Vsense node. The transistor 562 may comprise a low VT nMOS device. Clamp control circuit 564 controls the gate of transistor 562. The Vsense node is connected to reference current Tref and one input of sense amplifier 566. The other input of sense amplifier 566 receives Vref-read, which is the voltage level used for comparing the Vsense node voltage in read mode. The output of sense amplifier 566 is connected to the data out terminal and to data latch 568. Write circuit 560 is connected to node SELB, the Data In terminal, and data latch 568.

In one embodiment, during a read operation, read/write circuit 502 biases the selected bit line to the selected bit line voltage in read mode. Prior to sensing data, read/write circuit 502 will precharge the Vsense node to 2V (or some other voltage greater than the selected bit line voltage). When sensing data, read/write circuit 502 attempts to regulate the SELB node to the selected bit line voltage (e.g., 1V) via clamp control circuit 564 and transistor 562 in a source-follower configuration. If the current through the selected memory cell 550 is greater than the read current limit, Tref, then, over time, the Vsense node will fall below Vref-read (e.g., set to 1.5V) and the sense amplifier 566 will read out a data "0." Outputting a data "0" represents that the selected memory cell 550 is in a low resistance state (e.g., a SET state). If the current through the selected memory cell 550 is less than Tref, then the Vsense node will stay above Vref-read and the sense amplifier 566 will read out a data "1." Outputting a data "1" represents that the selected memory cell 550 is in a high resistance state (e.g., a RESET state). Data latch 568 may latch the output of sense amplifier 566 after a time period of sensing the current through the selected memory cell (e.g., after 400 ns).

In one embodiment, during a write operation, if the Data In terminal requests a data "0" to be written to a selected memory cell, then read/write circuit 502 may bias SELB to the selected bit line voltage for programming a data "0" in write mode (e.g., 1.2V for a SET operation) via write circuit 560. The duration of programming the memory cell may be a fixed time period (e.g., using a fixed-width programming pulse) or variable (e.g., using a write circuit 560 that senses whether a memory cell has been programmed while programming). If the Data In terminal requests a data "1" to be written, then read/write circuit 502 may bias SELB to the selected bit line voltage for programming a data "1" in write mode (e.g., 0V or −1.2V for a RESET operation) via write circuit 560. In some cases, if a selected memory cell is to maintain its current state, then the write circuit 560 may bias SELB to a program inhibit voltage during write mode. The program inhibit voltage may be the same as or close to the unselected bit line voltage.

FIG. 6A depicts one embodiment of a signaling interface between a controller 602 and a memory chip 603. As depicted, the signaling interface includes a pair of input signals 604 (labeled as read enable RE and read enable bar BRE) sent from the controller 602 to the memory chip 603, a pair of bidirectional data strobe signals 605 (labeled as DQS and BDQS), and an eight-bit data bus (IO[7:0]) driven by the memory chip 603. In some cases, the eight-bit data bus (IO[7:0]) may comprise a bidirectional databus between the memory chip 603 and the controller 602. The pair of bidirectional data strobe signals may comprise complementary data strobe signals; in other words, if one of the data strobe signals is at a high level, then the other data strobe signal should be at a low level and vice versa. In one embodiment, when transferring data from the memory chip 603 to the controller 602, the pair of input signals 604 may be used by a duty cycle correction circuit arranged within the memory chip 603 to generate and output the pair of bidirectional data strobe signals. The memory chip 603 may then transmit data over the data bus aligned with edge transitions of the pair of bidirectional data strobe signals. In one embodiment, memory chip 603 may comprise multiple die that are stacked and share the same input signals 604. In this case, each die may be calibrated by each die's on-chip duty cycle correction circuit in parallel and during the same time period. The controller 602 may utilize this time period to fix each die's unique duty cycle correction settings. This multi-die calibration may reduce system overhead without which the controller may need to tweak the settings die by die instead.

FIG. 6B depicts one embodiment of a duty cycle correction circuit. As depicted, the duty cycle correction circuit includes a high level delay code generator 612, a low level delay code generator 614, a delay line 615, control circuitry 616 for determining a midpoint delay setting, and control circuitry 617 for generating a duty cycle corrected output signal. The high level delay code generator 612 may include circuitry for determining a first delay setting corresponding with a first period of time during which an input signal (e.g., CLK_IN) is at a high level (e.g., 3V). The low level delay code generator 614 may include circuitry for determining a second delay setting corresponding with a second period of time during which the input signal is at a low level (e.g., 0V). The input signal may toggle between a high voltage level and a low voltage level during a particular period of time. The control circuitry 616 may determine a midpoint delay setting between the first delay setting and the second delay setting; the midpoint delay setting may correspond with a time that is between the first period of time and the second period of time. The midpoint delay setting may be used to control the delay line 615 for generating a delayed version of the input signal. The delay line may comprise one or more inverters, one or more current-starved inverters, or one or more tunable RC delay elements for delaying the input signal. The control circuitry 617 for generating a duty cycle corrected output signal may take as inputs the input signal and the delayed version of the input signal and generate the duty cycle corrected output signal by applying a logic function (e.g., an AND logic function or an OR logic function) to the input signal and the delayed version of the input signal. In one embodiment, the duty cycle correction circuit may be configured to generate the corrected output signal via application of a first logical operation (e.g., an ANDing operation) to the delayed version of the input signal and the input signal if the first period of time is greater than the second period of time or application of a second logical operation (e.g., an ORing operation) to the delayed version of the input signal and the input signal if the first period of time is not greater than the second period of time. In one embodiment, if there is any concern of mismatch between the two calibration engines 612 and 614, an alternative implementation is to use only one calibration engine. For example, a calibration engine 612 may be used to generate both high level and low level delay codes. Some additional circuits, such as storage elements and combinational logic, may be added to configure the calibration engine 612 to generate both the high level and low level delay codes.

FIG. 6C depicts another embodiment of a duty cycle correction circuit. As depicted, the duty cycle correction circuit includes a first AND gate 624, a first delay line 625, a second AND gate 622, a second delay line 623, a third delay line 621, control circuitry 626 for determining a first delay setting corresponding with a first period of time during which an input signal (e.g., CLK_IN) is at a high level (e.g., 3V), control circuitry 627 for determining a second delay setting corresponding with a second period of time during which the input signal is at a low level (e.g., 0V), control circuitry 628 for determining a midpoint delay setting corresponding with a delay between the first period of time and the second period of time, and control circuitry 629 for generating a duty cycle corrected output signal. The control circuits 626-629 may comprise combinational logic and/or state machines. The delay lines 621, 623, and 625 may be implemented using one or more inverters, one or more current-starved inverters, or one or more RC delay elements for delaying the input signal.

Figure 6D:
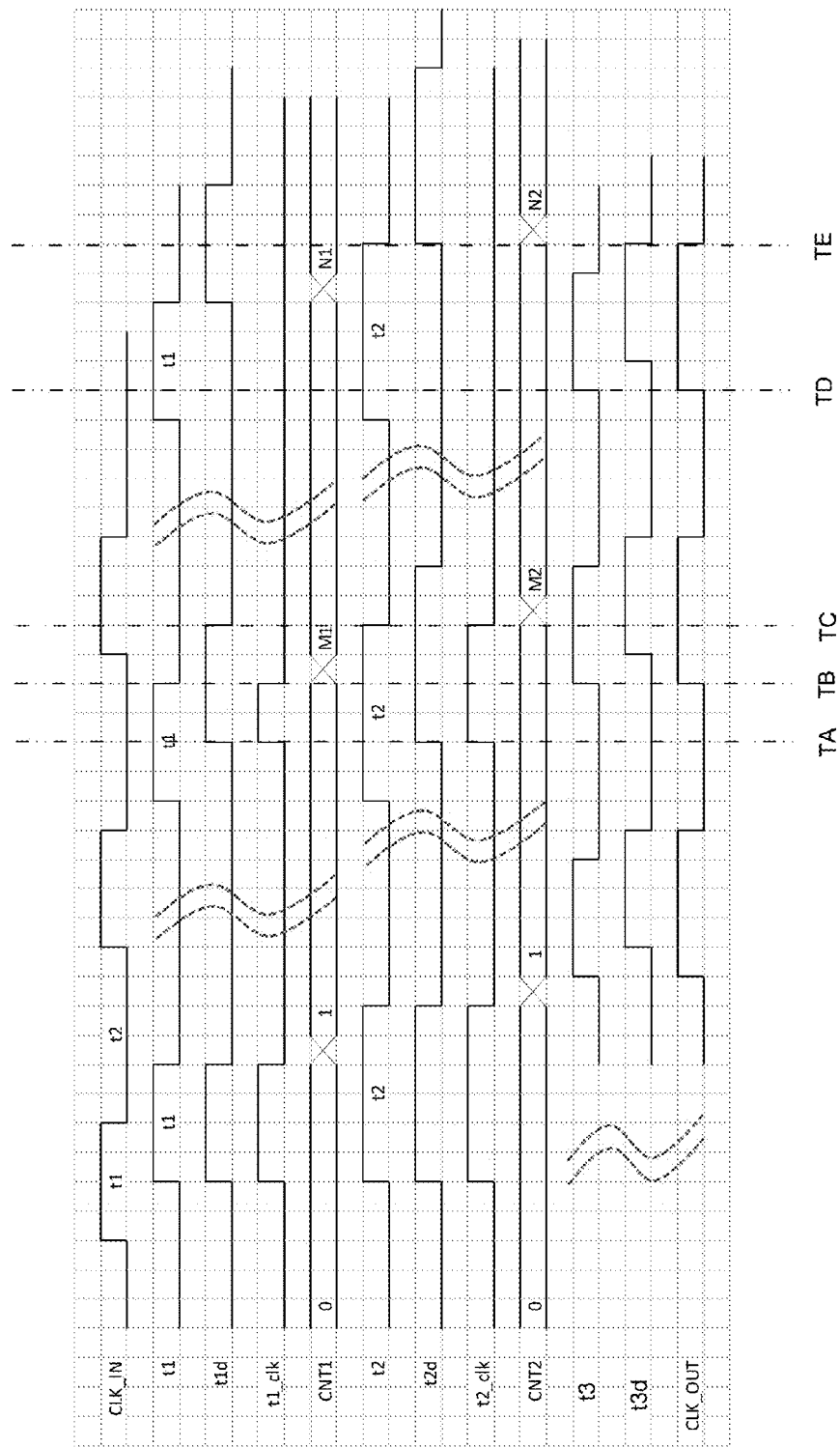
FIG. 6D depicts one embodiment of voltage waveforms corresponding with operation of the duty cycle correction circuit depicted in FIG. 6C.

FIG. 6D depicts one embodiment of voltage waveforms corresponding with operation of the duty cycle correction circuit depicted in FIG. 6C. As depicted, the first delay line 625 generates delayed signal t1$d$ based on a delay setting or code from the control circuit 626 and the second delay line 623 generates delayed signal t2$d$ based on a delay setting or code from the control circuit 627. The overlap in node t1 being at a high level (e.g., 3V or 1.5V) while node t1$d$ is also at the high level causes t1_clk to pulse high between times TA and TB. Similarly, the overlap in node t2 being at a high level (e.g., 3V or 1.5V) while node t2$d$ is also at the high level causes t2_clk to pulse high between times TA and TC. The node t1_clk may be used as an input signal to control circuitry 626 that acts as a first digital counter and node t2_*clk* may be used as an input signal to control circuitry 627 that acts as a second digital counter. Once the delay of the first delay line 625 is equal to or greater than the period of time that the node t1 is at a high level, then the output of the first AND gate 624 will no longer create a pulse and the delay setting or code applied to the first delay line 625 will no longer be incremented. Similarly, once the delay of the second delay line 623 is equal to or greater than the period of time that the node t2 is at a high level, then the output of the second AND gate 622 will no longer create a pulse and the delay setting or code applied to the second delay line 623 will no longer be incremented. The control circuitry 628 for determining a midpoint delay setting may determine a delay setting that is between the delay setting applied to the first delay line 625 and the second delay line 623. In some cases, the midpoint delay setting may comprise a delay that is half way between the delay setting applied to the first delay line 625 and the second delay line 623. The third delay line 621 second period of time. Otherwise, if t2_*clk* pulses longer than t1_*clk* in the same calibration sequence, then the second period of time is greater than the first period of time. In one embodiment, the determination of whether the first period of time is greater than the second period of time may be performed by comparing the values of the digital counters (e.g., the higher digital count may correspond with the greater period of time) or directly comparing the first delay setting corresponding with a first period of time during which the input signal is at a high level with the second delay setting corresponding with a second period of time during which the input signal is at a low level.

Figure 6E:
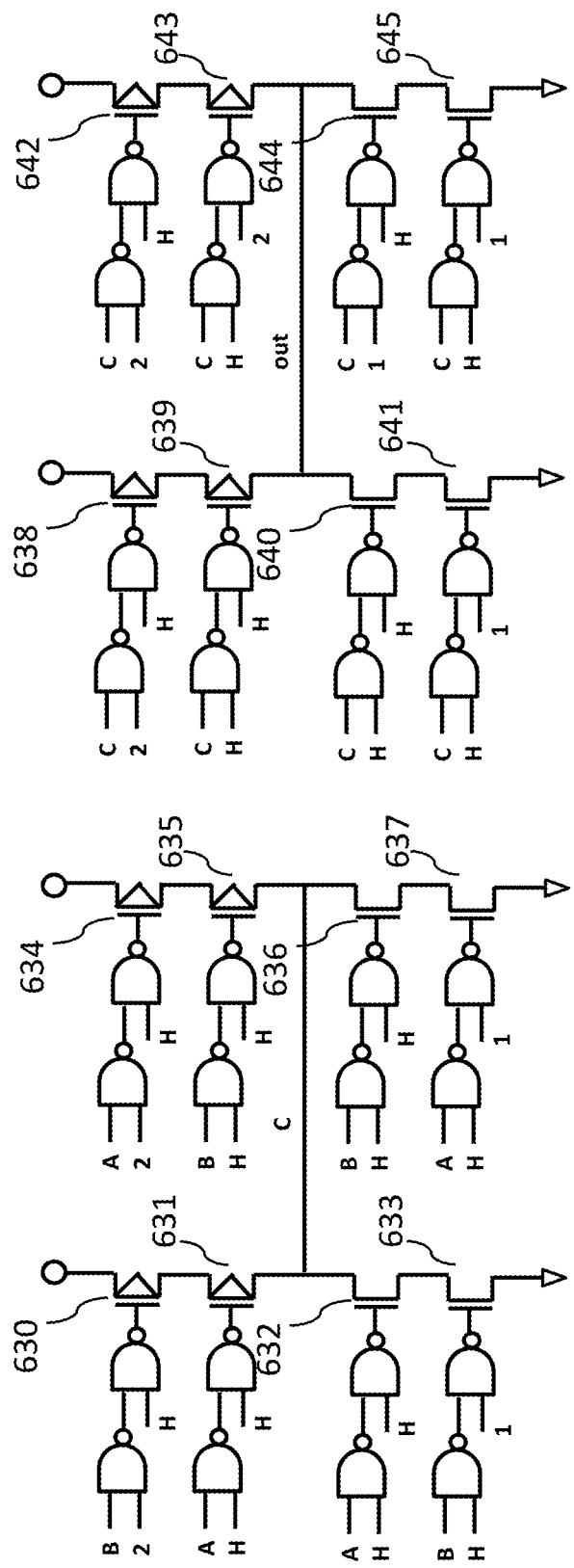
FIG. 6E depicts one embodiment of a portion of circuitry for enabling duty cycle correction.

In one embodiment, in reference to FIG. 6E, A depicts signal at node t3 and B depicts signal at node t3*d*, H depicts voltage high and 1, 2 depict flag signals generated from t1_*clk* and t2_*clk*. If t1_*clk* is greater than t2_*clk*, then flag signal 1 is high and flag signal 2 is low, gate of 630-645 is following below table for t1_*clk* to form AND structure:

| 630 | 631 | 632 | 633 | 634 | 635 | 636 | 637 | 638 | 639 | 640 | 641 | 642 | 643 | 644 | 645 |
|---|---|---|---|---|---|---|---|---|---|---|---|---|---|---|---|
| 0 | A | A | B | 0 | B | B | A | 0 | C | C | C | 0 | C | C | C | for t2_clk to form OR structure:

| B | A | A | 1 | A | B | B | 1 | C | C | C | 1 | C | 1 | 0 | 1 |
|---|---|---|---|---|---|---|---|---|---|---|---|---|---|---|---|

If t2_clk is greater than t1_clk, flag signal 1 is low and flag signal 2 is high, gate of 630-645 is following below table for t1_clk to form OR structure:

| B | A | A | 1 | A | B | B | 1 | C | C | C | 1 | C | C | 0 | 1 |
|---|---|---|---|---|---|---|---|---|---|---|---|---|---|---|---| for t2_clk to form AND structure:

| 0 | A | A | B | 0 | B | B | A | 0 | C | C | C | 0 | 1 | C | C |
|---|---|---|---|---|---|---|---|---|---|---|---|---|---|---|---| generates delayed signal t3*d* based on a delay setting or code from the control circuit 628. The control circuitry 629 may generate a duty cycle corrected output signal using the signals at nodes t3 and t3*d*. In one example, the duty cycle corrected output signal may be generated by applying a logical AND function to the signals at nodes t3 and t3*d*. In another example, the duty cycle corrected output signal may be generated by applying a logical OR function to the signals at nodes t3 and t3*d*. Between times TD and TE, the output signal CLK_OUT generated by the control circuit 629 comprises the logical ORing of the signals at nodes t3 and t3*d*. In this case, the period of time during which the resulting output signal CLK_OUT is at a high level is greater than the period of time during which the node t3 is at the high level.

In one embodiment, the logical function to be applied to the signals at nodes t3 and t3*d* in order to generate the resulting duty cycle corrected output signal may be determined based on whether a first period of time during which t3 is at a high level is greater than a second period of time during which t3 is at a low level. If the first period of time is greater than the second period of time, then a logical ANDing of the signals at nodes t3 and t3*d* may be performed. If the first period of time is less than the second period of time, then a logical ORing of the signals at nodes t3 and t3*d* may be performed.

In some cases, an RS latch taking t1_*clk* and t2_*clk* as inputs may be used to determine whether the first period of time is greater than the second period of time. In this case, if t1_*clk* pulses longer than t2_*clk* in the same calibration sequence, then the first period of time is greater than the In some cases, the duty cycle correction circuit depicted in FIG. 6B and/or the duty cycle correction circuit depicted in FIG. 6C may be immune to or reduce common errors or systematic errors on the circuit paths for determining a first delay setting corresponding with a first period of time during which an input signal is at a high level and for determining a second delay setting corresponding with a second period of time during which the input signal is at a low level. Because of the arithmetic subtraction algorithm, the design is robust and immune to any errors caused by all common circuits and operating environments. In one example, common errors or systematic errors in the counters for generating t1_*clk* and t2_*clk* may be eliminated due to the subtraction of the errors when determining the midpoint delay setting. For example, assume due to local variations, the two calibration engines of 612 and 614 shows mismatch, an alternative implementation is to use only one engine to eliminate local variations. In one example of counter error shown in below table:

| t1 DAC | t2 DAC | t3 DAC | t4 DAC | t1' DAC [t1-t3] | t2' DAC [t2-t4] | $\Delta t$ DAC [\|t2-t1\|/2] | $\Delta t'$ DAC [\|t2'-t1'\|/2] |
|---|---|---|---|---|---|---|---|
| 16 | 22 | 5 | 5 | 16-5 = 11 | 22-5 = 17 | (22-16)/2 = 3 | (17-11)/2 = 3 | t1 depicts the true DAC of t1_*clk* if there is no counter error, t2 depicts the true DAC of t2_*clk* if there is no counter error, t3 depicts the first counter's detectable minimum pulse width respective DAC, t4 depicts the second counter's detectable minimum pulse width respective DAC, t1' depicts the detected DAC of t1_clk, t2' depicts the detected DAC of t2_clk, Δt depicts the mid-point delay DAC if there is no counter error, whose equation is lt2 DAC−t1 DAC1/2, and Δt' depicts the detected mid-point delay DAC, whose equation is lt2' DAC−t1' DAC1/2. In above example's table, t1_clk and t2_clk will both see the common counter error t3 DAC 5 and t4 DAC 5, so the final detected Δt' DAC is the same number 3 with the wanted mid-point delay DAC Δt calculated based on the subtraction equation, the counter error is eliminated.

Figure 6F:
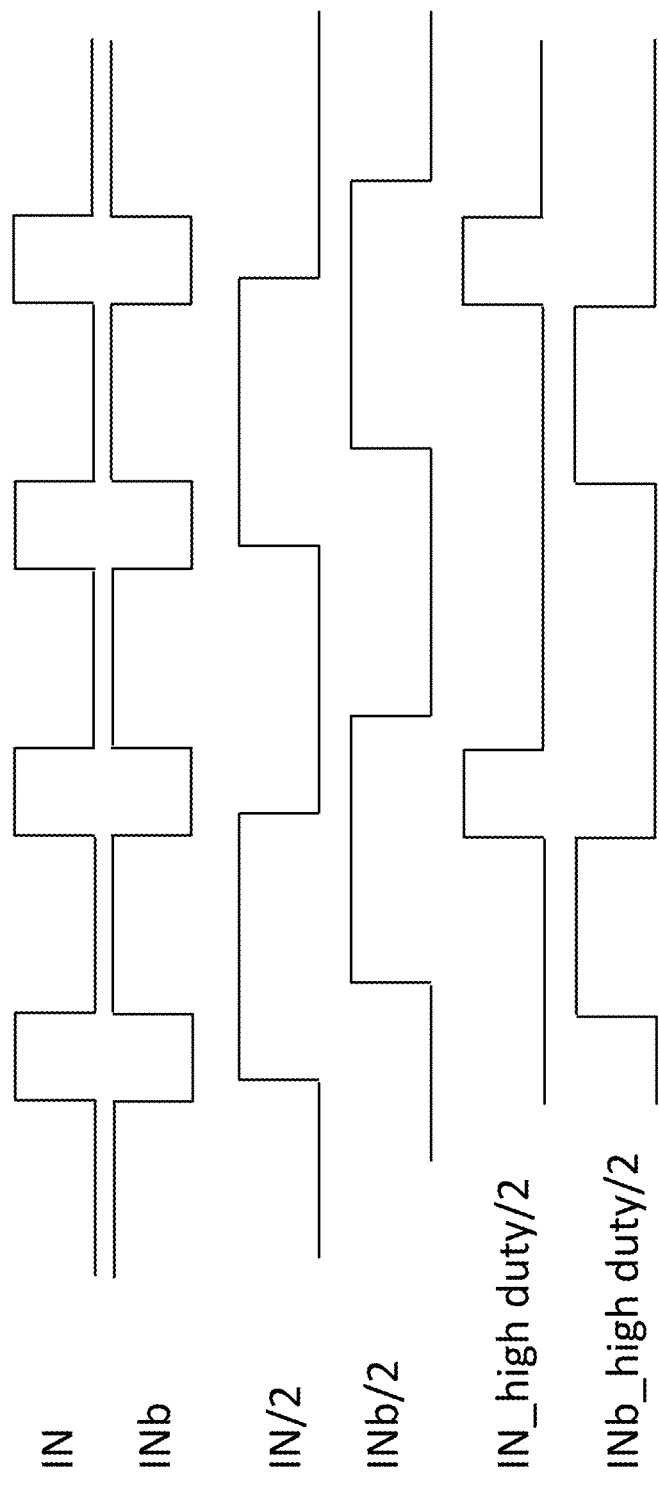
FIG. 6F depicts an input signal clock frequency manipulation flowchart.

FIG. 6F depicts an input signal clock frequency manipulation flowchart. IN and INb depict a pair of differential input signal or one input signal and inverted version of it passing an inverter. IN/2 depicts IN signal passing a half frequency divider and INb/2 depicts INb signal passing a half frequency divider. IN_high duty/2 depicts the AND output of IN signal and INb/2 signal and it includes the same pulse width of IN signal's high level duty with double the clock cycle period of IN signal, INb_high duty/2 depicts the AND output of INb signal and IN/2 signal and it includes the same pulse width of INb signal's high level duty or IN signal's low level duty with double the clock cycle period of INb signal or IN signal. In some cases, if the input signal's clock frequency is higher than the time calibration engine feedback loop needs, this clock frequency manipulation circuit may lower the input signal clock frequency without deteriorating the duty information to be corrected of the input signal. In some cases, the IN_high duty/2 and INb_high duty/2 may be feedback into IN and INb signal to further reduce the frequency of the signals to be used by the calibration engine and thus the input signal does not have any frequency limitation. Any error this frequency manipulation circuit encountered is also one example of the common error of the duty cycle correction circuit described above and is canceled out.

Figure 7:
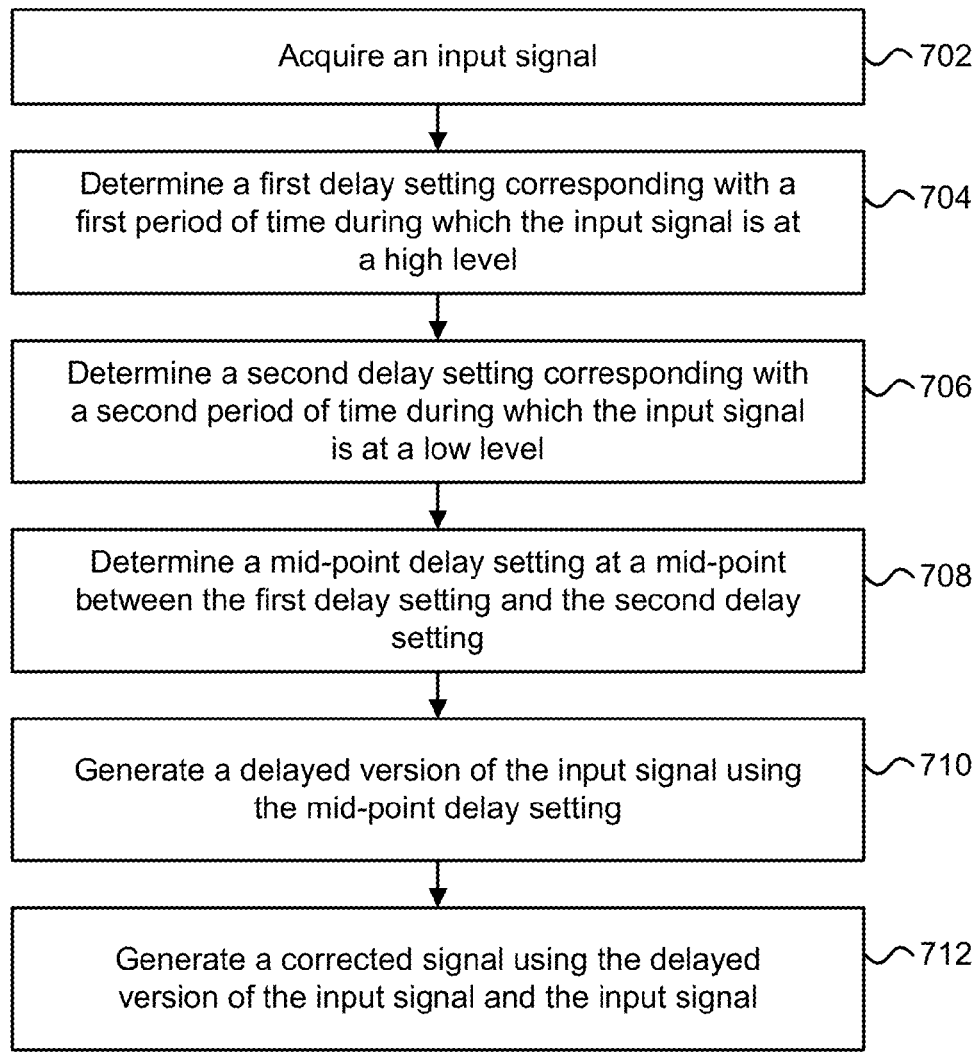
FIG. 7 is a flowchart describing one embodiment of a process for performing duty cycle correction.

FIG. 7 is a flowchart describing one embodiment of a process for performing duty cycle correction. In one embodiment, the process of FIG. 7 may be performed by a duty cycle correction circuit, such as the duty cycle correction circuit depicted in FIG. 6B or the duty cycle correction circuit depicted in FIG. 6C.

In step 702, an input signal is acquired. The input signal may comprise one of a pair of input signals (e.g., differential clock signals comprising CLK and CLK_bar). The input signal may comprise a clock signal or a periodic signal that toggles between a low voltage level (e.g., 0V) and a high voltage level (e.g., 3V). The input signal may continuously toggle between the low voltage level and the high voltage level or toggle between the low voltage level and the high voltage level during a period of time (e.g., a gated clocking signal that only toggles while reading or writing data to a memory chip). In one example, the input signal may be delivered or transmitted via a read-enable RE pin on a memory chip. The input signal may toggle between the low voltage level and the high voltage level during a period of time corresponding with a memory operation being performed by a memory chip. In step 704, a first delay setting corresponding with a first period of time during which the input signal is at a high level is determined. In step 706, a second delay setting corresponding with a second period of time during which the input signal is at a low level is determined. In step 708, a mid-point delay setting at a mid-point (or half way point) between the first delay setting and the second delay setting is determined. In some cases, the mid-point delay setting may comprise a middle point or a mid-point of the difference between the first delay setting and the second delay setting. In step 710, a delayed version of the input signal is generated using the mid-point delay setting. In step 712, a corrected signal is generated using the delayed version of the input signal and the input signal. The corrected signal may be outputted as a data strobe signal. The corrected signal may comprise a duty cycle corrected signal that is transmitted from a memory die as a synchronizing signal along with data being transmitted from the memory die (e.g., data stored within the memory die being transmitted to a memory controller or host).

In some embodiments, the corrected signal may be generated via application of a first logical operation (e.g., a logical AND operation) to the delayed version of the input signal and the input signal if a first period of time during which the input signal is at a high level is greater than a second period of time during which the input signal is at a low level or application of a second logical operation (e.g., a logical OR operation) to the delayed version of the input signal and the input signal if the first period of time is not greater than the second period of time.

In some cases, the control circuit 626, delay line 625, and AND gate 624 in FIG. 6C may comprise a representative example of means for determining a first delay setting corresponding with a first period of time during which an input signal is at a high level. In some cases, the control circuit 627, delay line 623, and AND gate 622 in FIG. 6C may comprise a representative example of means for determining a second delay setting corresponding with a second period of time during which an input signal is at a low level. In some cases, the control circuit 629 may comprise a representative example of means for generating a duty cycle corrected output signal by applying a logical function to two or more signals (e.g., the signals at nodes t3 and t3d in FIG. 6C). In some cases, the delay line 625 and AND gate 624 in FIG. 6C may comprise a representative example of means for generating a first pulse if a delay of a first delay line is less than a first period of time during which an input signal is at a high level. The delay line 623 and AND gate 622 in FIG. 6C may comprise a representative example of means for generating a second pulse if a delay of a second delay line is less than a second period of time during which the input signal is at a low level.

One embodiment of the disclosed technology includes a first circuit configured to determine a first delay setting corresponding with a first period of time during which an input signal is at a high voltage level, a second circuit configured to determine a second delay setting corresponding with a second period of time during which the input signal is at a low voltage level less than the high voltage level, a mid-point selection circuit configured to determine a mid-point delay setting at a mid-point between the first delay setting and the second delay setting and generate a delayed version of the input signal using the mid-point delay setting, and a duty cycle adjustment circuit configured to generate a corrected signal via application of a first logical operation to the delayed version of the input signal and the input signal if the first period of time is greater than the second period of time or application of a second logical operation to the delayed version of the input signal and the input signal if the first period of time is not greater than the second period of time.

One embodiment of the disclosed technology includes means for generating a first pulse if a delay of a first delay line is less than a first period of time during which an input signal is at a high level, means for generating a second pulse if a delay of a second delay line is less than a second period of time during which the input signal is at a low level, a first counter configured to determine a first delay setting using the first pulse, a second counter configured to determine a second delay setting using the second pulse, and a control circuit configured to determine a mid-point delay setting at a mid-point between the first delay setting and the second delay setting and generate a delayed version of the input signal using the mid-point delay setting. The control circuit configured to generate a corrected signal via application of a first logical operation to the delayed version of the input signal and the input signal if the first period of time is greater than the second period of time or application of a second logical operation to the delayed version of the input signal and the input signal if the first period of time is not greater than the second period of time.

One embodiment of the disclosed technology includes determining a first delay setting corresponding with a first period of time during which an input signal is at a high voltage level, determining a second delay setting corresponding with a second period of time during which the input signal is at a low voltage level less than the high voltage level, calculating a mid-point delay setting at a mid-point between the first delay setting and the second delay setting, generating a delayed version of the input signal using the mid-point delay setting, and generating a corrected signal via application of a first logical operation to the delayed version of the input signal and the input signal if the first period of time is greater than the second period of time or application of a second logical operation to the delayed version of the input signal and the input signal if the first period of time is not greater than the second period of time.

In some embodiments, the two calibration sequence of an input signal at high voltage level and an input signal at low voltage level are immune to common circuit errors and are canceled out.

Also, a first counter detecting an AND output of an input signal at high voltage level and an input signal at high voltage level passing a first delay line; a first counter clock pulse period shrink by a first delay line number after each calibration sequence; a second counter detecting an AND output of an input signal at low voltage level and an input signal at low voltage level passing a second delay line; a second counter clock pulse period shrink by a second delay line number after each calibration sequence.

Moreover, the first counter clock pulse period stop at a first detectable minimum pulse width; the second counter clock pulse period stop at a second detectable minimum pulse width; the first detectable minimum pulse width equals to the second detectable minimum pulse width and is one common circuit error and is canceled out.

Moreover, a calibration configured to happen the same time on multi-die stacking sharing the same input signal at the unique operation process, voltage and temperature condition of each die, multi-die calibration reduce the overhead of controller calibrating each die separately and thus increase the system performance.

Moreover, a first circuit configured to determine a first delay setting corresponding with a first period of time during which an input signal is at a high voltage level and a second delay setting corresponding with a second period of time during which an input signal is at a low voltage level, the second calibration is in series with the first calibration using the same circuit and reduce local variation; a mid-point selection circuit configured to determine a mid-point delay setting after second delay setting with stored first delay setting.

Moreover, the duty cycle adjustment circuit configured to detect that the first period of time is greater than the second period of time using an RS latch during the same calibration sequence. After the calibration finish, the RS latch output will feedback stable flag signals onto the input signal and the delayed version of input signal to have the first AND logical operation.

For purposes of this document, a first layer may be over or above a second layer if zero, one, or more intervening layers are between the first layer and the second layer.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus, comprising:
 a first circuit configured to determine a first delay setting corresponding with a first period of time during which an input signal is at a high voltage level;
 a second circuit configured to determine a second delay setting corresponding with a second period of time during which the input signal is at a low voltage level less than the high voltage level;
 a mid-point selection circuit configured to determine a mid-point delay setting at a mid-point between the first delay setting and the second delay setting and generate a delayed version of the input signal using the mid-point delay setting; and
 a duty cycle adjustment circuit configured to generate a corrected signal via application of a first logical operation to the delayed version of the input signal and the input signal if the first period of time is greater than the second period of time or application of a second logical operation to the delayed version of the input signal and the input signal if the first period of time is not greater than the second period of time.

2. The apparatus of claim 1, wherein:
the first logical operation comprises a logical AND operation; and
the second logical operation comprises a logical OR operation.

3. The apparatus of claim 1, wherein:
the first circuit comprises a first AND gate and a first delay line; and
the second circuit comprises a second AND gate and a second delay line.

4. The apparatus of claim 3, wherein:
the first circuit configured to increment a first digital counter to increase a delay of the first delay line; and
the second circuit configured to increment a second digital counter to increase a delay of the second delay line.

5. The apparatus of claim 4, wherein:
the first circuit configured to generate a first pulse if the delay of the first delay line is less than the first period of time; and
the second circuit configured to generate a second pulse if the delay of the second delay line is less than the second period of time.

6. The apparatus of claim 5, wherein:
the first circuit configured to increment the delay of the first delay line in response to detecting the first pulse; and
the second circuit configured to increment the delay of the second delay line in response to detecting the second pulse.

7. The apparatus of claim 1, wherein:
the duty cycle adjustment circuit configured to detect that the first period of time is greater than the second period of time using an RS latch.

8. The apparatus of claim 1, wherein:
the duty cycle adjustment circuit configured to detect that the first period of time is greater than the second period of time by detecting that the first delay setting is greater than the second delay setting.

9. The apparatus of claim 1, wherein:
the input signal comprises one signal of a pair of differential clock signals; and
the mid-point selection circuit configured to determine a difference between the first delay setting from the second delay setting.

10. The apparatus of claim 1, wherein:
the duty cycle adjustment circuit is arranged on an integrated circuit; and
the corrected signal comprises a data strobe signal transmitted from the integrated circuit.

11. The apparatus of claim 10, wherein:
the integrated circuit comprises a ReRAM memory.

12. The apparatus of claim 10, wherein:
the integrated circuit comprises a three-dimensional memory array.

13. The apparatus of claim 10, wherein:
the integrated circuit comprises a non-volatile memory that is monolithically formed in one or more physical levels of memory cells having active areas disposed above a silicon substrate.

14. A system, comprising:
means for generating a first pulse if a delay of a first delay line is less than a first period of time during which an input signal is at a high level;
means for generating a second pulse if a delay of a second delay line is less than a second period of time during which the input signal is at a low level;
a first counter configured to determine a first delay setting using the first pulse;
a second counter configured to determine a second delay setting using the second pulse; and
a control circuit configured to determine a mid-point delay setting at a mid-point between the first delay setting and the second delay setting and generate a delayed version of the input signal using the mid-point delay setting, the control circuit configured to generate a corrected signal via application of a first logical operation to the delayed version of the input signal and the input signal if the first period of time is greater than the second period of time or application of a second logical operation to the delayed version of the input signal and the input signal if the first period of time is not greater than the second period of time.

15. The system of claim 14, wherein:
the first logical operation comprises a logical AND operation; and
the second logical operation comprises a logical OR operation.

16. The system of claim 14, wherein:
the control circuit configured to detect that the first period of time is greater than the second period of time by comparing the first delay setting with the second delay setting.

17. The system of claim 14, wherein:
the control circuit is arranged on an integrated circuit; and
the corrected signal comprises a data strobe signal transmitted from the integrated circuit.

18. The system of claim 17, wherein:
the integrated circuit comprises a memory chip.

19. A method, comprising:
determining a first delay setting corresponding with a first period of time during which an input signal is at a high voltage level;
determining a second delay setting corresponding with a second period of time during which the input signal is at a low voltage level less than the high voltage level;
calculating a mid-point delay setting at a mid-point between the first delay setting and the second delay setting;
generating a delayed version of the input signal using the mid-point delay setting; and
generating a corrected signal via application of a first logical operation to the delayed version of the input signal and the input signal if the first period of time is greater than the second period of time or application of a second logical operation to the delayed version of the input signal and the input signal if the first period of time is not greater than the second period of time.

20. The method of claim 19, wherein:
the first logical operation comprises a logical AND operation;
the second logical operation comprises a logical OR operation; and
the calculating the mid-point delay setting includes determining a difference between the first delay setting and the second delay setting.

* * * * *